(12) United States Patent
Chin

(10) Patent No.: US 11,749,604 B2
(45) Date of Patent: Sep. 5, 2023

(54) RUTHENIUM OXIDE FILM AND RUTHENIUM LINER FOR LOW-RESISTANCE COPPER INTERCONNECTS IN A DEVICE

(71) Applicant: Taiwan Semiconductor Manufacturing Company, Ltd., Hsinchu (TW)

(72) Inventor: Shu-Cheng Chin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 117 days.

(21) Appl. No.: 17/248,595

(22) Filed: Jan. 29, 2021

(65) Prior Publication Data

US 2022/0246535 A1   Aug. 4, 2022

(51) Int. Cl.
*H01L 23/532*   (2006.01)
*H01L 23/522*   (2006.01)
*H01L 21/768*   (2006.01)

(52) U.S. Cl.
CPC .. *H01L 23/53238* (2013.01); *H01L 21/76807* (2013.01); *H01L 21/76846* (2013.01); *H01L 21/76856* (2013.01); *H01L 23/5226* (2013.01)

(58) Field of Classification Search
CPC ......... H01L 21/76843; H01L 21/76846; H01L 21/76849; H01L 21/76862; H01L 21/76814; H01L 21/76807; H01L 23/53238; H01L 23/5226
See application file for complete search history.

(56) References Cited

U.S. PATENT DOCUMENTS

| | | | | |
|---|---|---|---|---|
| 9,806,018 | B1* | 10/2017 | Clevenger | H01L 21/76879 |
| 2008/0083989 | A1* | 4/2008 | Aoi | H01L 21/28562 |
| | | | | 257/E21.171 |
| 2019/0244896 | A1* | 8/2019 | Lee | H01L 23/5226 |
| 2021/0287994 | A1* | 9/2021 | Hsueh | H01L 21/76832 |
| 2022/0246534 | A1* | 8/2022 | Chin | H01L 21/76867 |

* cited by examiner

*Primary Examiner* — Jaehwan Oh
*Assistant Examiner* — John M Parker
(74) *Attorney, Agent, or Firm* — Harrity & Harrity, LLP

(57) ABSTRACT

Selective ruthenium and selective ruthenium oxide may be used in single damascene processes and/or dual damascene processes to form BEOL metallization layers and vias of an electronic device. A selective ruthenium liner may be formed to achieve a low contact resistance and a low sheet resistance for the BEOL metallization layers and vias, to promote adhesion between the various layers and materials in the BEOL metallization layers and vias, and/or to reduce or eliminate defects (such as voids and discontinuities) in the BEOL metallization layers and vias.

20 Claims, 30 Drawing Sheets

RUTHENIUM OXIDE FILM AND RUTHENIUM LINER FOR LOW-RESISTANCE COPPER INTERCONNECTS IN A DEVICE

BACKGROUND

A back end of line (BEOL) region is a region of an electronic device (e.g., a processor, a memory) in which individual semiconductor devices (e.g., transistors, capacitors, resistors) are interconnected by metallization layers (also referred to as wires) and vias that connect the metallization layers. A metallization layer and one or more vias may be formed during the same fabrication process referred to as a dual damascene process. In a dual damascene process, the vias and the trenches for the metallization layer are etched using either a via-first procedure or a trench-first procedure. Then, the trench and the vias are filled with a conductive material in the same plating operation (e.g., electroplating).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
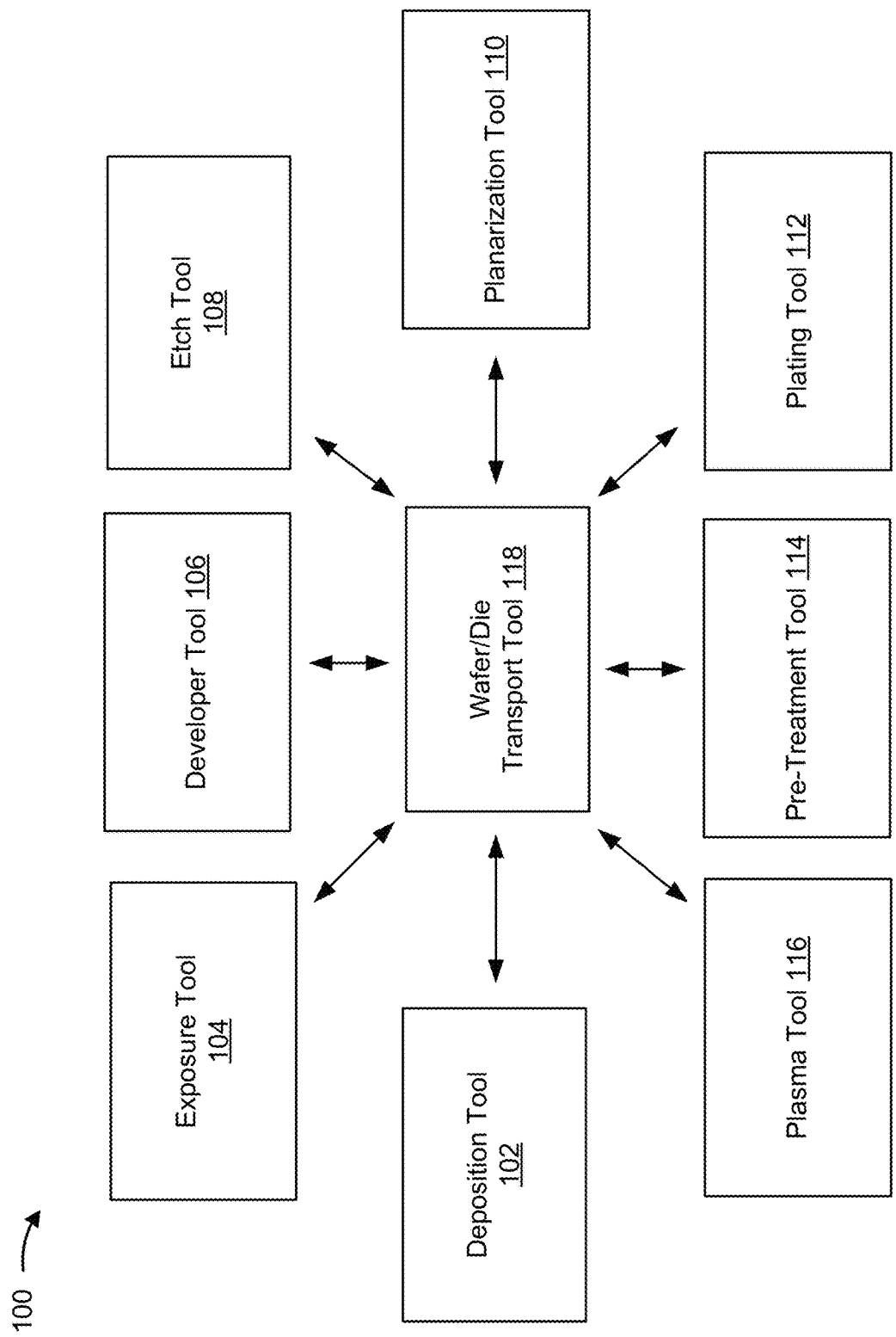
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Copper has become the material of choice for BEOL metallization layers and vias due to the lower contact resistance and sheet resistance relative to other conductive materials such as aluminum. The lower resistivity of copper provides lower resistance/capacitance (RC) time constants and faster propagation of signals across an electronic device. However, copper exhibits drawbacks such as a high diffusion (or electromigration) rate, which can cause copper atoms to diffuse into surrounding dielectric material. This can cause an increase in resistivity for back end of line (BEOL) metallization layers and vias, which can decrease electrical performance of an electronic device. Moreover, diffusion may result in copper atoms migrating into lower device layers (e.g., front end of line (FEOL) layers), which can cause semiconductor device failures and reduced manufacturing yield.

Various techniques described herein include using ruthenium (Ru) or a combination of ruthenium and ruthenium oxide ($RuO_x$) in the formation of BEOL metallization layers and vias of an electronic device. The techniques described herein may be performed as part of a single damascene process or a dual damascene process to achieve a low contact resistance and a low sheet resistance for the BEOL metallization layers and vias (e.g., relative to the use of other types of liners and barrier layers such as tantalum nitride (TaN)), to promote adhesion between the various layers and materials in the BEOL metallization layers and vias, and/or to reduce or eliminate defects (such as voids, islands, and other discontinuities) in the BEOL metallization layers and vias. This may increase the electrical performance of the electronic device and may increase manufacturing yield.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, an pre-treatment tool 114, a plasma tool 116, and/or another type of semiconductor processing tool. The tools included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotopically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The pre-treatment tool 114 is a semiconductor processing tool that is capable of using various types of wet chemicals and/or gasses to treat the surface of one or more layers of a device in preparation for one or more subsequent semiconductor processing operations. For example, the pre-treatment tool 114 may include a chamber in which a device may be placed. The chamber may be filled with a wet chemical and/or a gas that is used to modify the physical and/or chemical properties of one or more layers of a device.

The plasma tool 116 is a semiconductor processing tool, such as a decoupled plasma source (DPS) tool, an inductively coupled plasma (ICP) tool, a transformer coupled plasma (TCP) tool, or another type of plasma-based semiconductor processing tool, that is capable of treating the surface of one or more layers of a device using a plasma. For example, the plasma tool 116 may sputter etch or otherwise remove material from the surface of a layer of a device using plasma ions.

Wafer/die transport tool 118 includes a mobile robot, a robot arm, a tram or rail car, and/or another type of device that is used to transport wafers and/or dies between semiconductor processing tools 102-116 and/or to and from other locations such as a wafer rack, a storage room, and/or the like. In some implementations, wafer/die transport tool 118 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
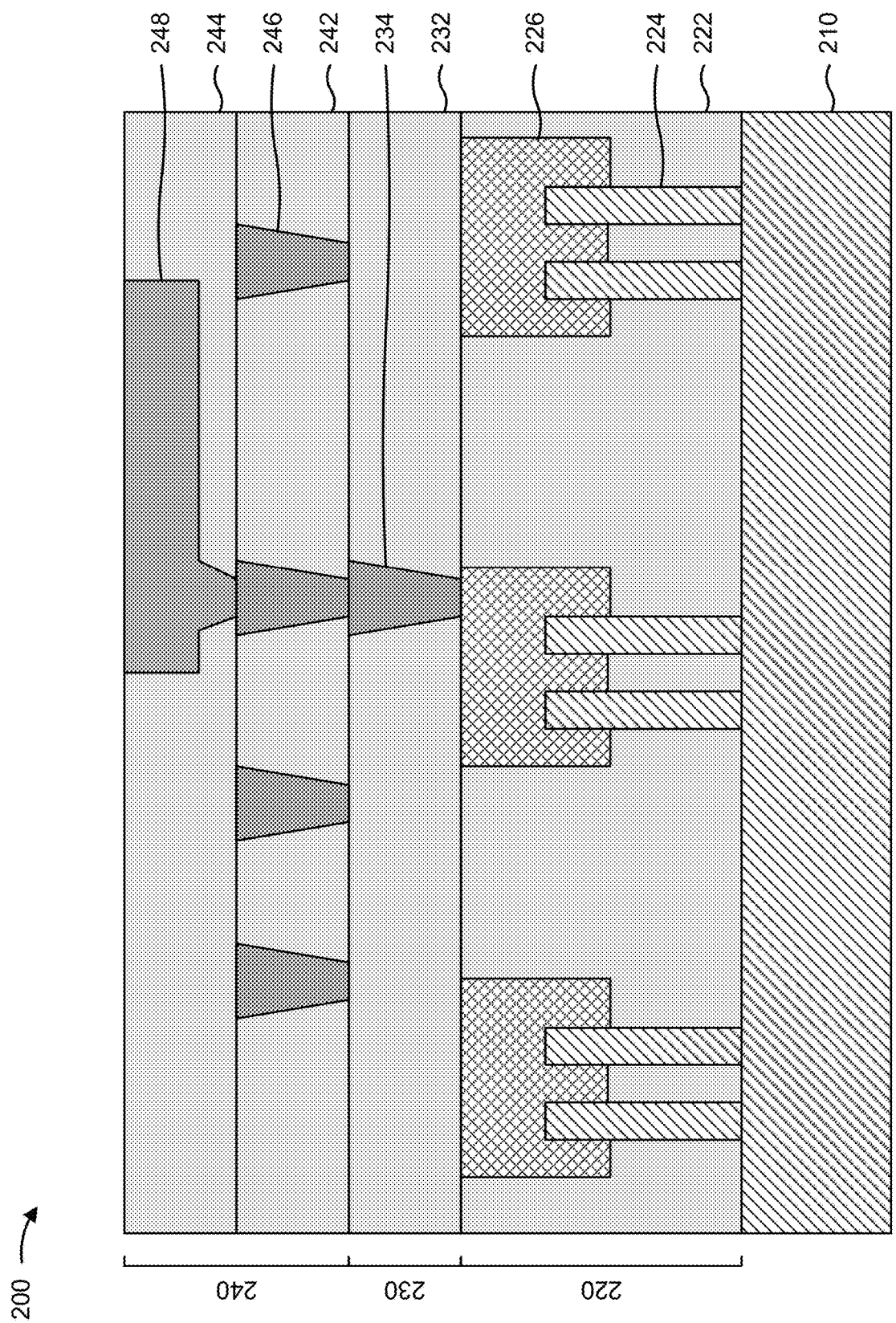
FIG. 2 is a diagram of a portion of an example electronic device described herein.

FIG. 2 is a diagram of a portion of an example device 200 described herein. Device 200 may include an electronic device such as a processor, a memory device, or another type of electronic device. As shown in FIG. 2, the device 200 may include various device regions, such as a substrate 210, an FEOL region 220, a middle end of line (MEOL) region 230, and a BEOL region 240. The substrate 210 may include a region of the device 200 in and/or on which semiconductor devices of the device 200 may be formed. The substrate 210 may include a semiconductor die substrate, a semiconductor wafer, or another type of substrate in and/or on which semiconductor devices may be formed. In some implementations, the substrate 210 is formed of silicon (Si), a material including silicon, a III-V compound semiconductor material such as gallium arsenide (GaAs), a silicon on insulator (SOI), or another type of semiconductor material.

The FEOL region 220 may be formed in and/or on the substrate 210. The FEOL region 220 may include a dielectric layer 222 formed of a low-k or low dielectric constant material such as a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide ($AlO_x$). The FEOL region 220 may further include the semiconductor devices of the device 200. The semiconductor devices may be formed in the dielectric layer 222 and may include transistors, capacitors, resistors, lasers, light emitting diodes (LEDs), and/or other types of semiconductor-based electrical devices. Transistors included in the FEOL region 220 may include, for example, planar transistors, fin field-effect transistors (FinFETs), and/or other types of transistors. The FinFETs may include traditional FinFETs, nano-sheet FinFETs, nano-wire FinFETs, and/or other types of FinFETs. A transistor may include one or more source or drain regions 224 formed in and/or on the substrate 210 and a metal gate 226.

The MEOL region 230 may be formed on the FEOL region 220, and may electrically connect the FEOL region 220 to the BEOL region 240. The MEOL region 230 may include a dielectric layer 232 and contact vias (also referred to as contact plugs) 234 formed in the dielectric layer 232. The contact vias 234 may electrically connect to the source or drain regions 224 and the metal gates 226 of the semiconductor devices of the FEOL region 220. A contact via 234 may include one or more metals, such as tungsten, cobalt, or ruthenium.

The BEOL region 240 may be formed on the MEOL region 230. The BEOL region 240 may electrically interconnect the semiconductor devices of the FEOL region 220, and may electronically connect the semiconductor devices of the FEOL region 220 with external packaging of the device 200. The BEOL region 240 may include one or more dielectric layers (e.g., dielectric layer 242, dielectric layer 244, and/or one or more other dielectric layers). The BEOL region 240 may further include metallization layers and vias formed in the one or more dielectric layers. A metallization layer may provide electrical connections between vias. A circuitry via may provide interconnections between semiconductor devices. A seal ring via may provide protection and/or isolation of inner circuitry of the device 200 from cracks and moisture, and may electrically connect multiple semiconductor dies of the device 200.

Single damascene structures 246 included in the one or more dielectric layers may function as vias between metallization layers in the BEOL region 240. Dual damascene structures 248 may function as metallization layers and vias in the BEOL region 240. Single damascene structures 246 and dual damascene structures 248 may include various types of conductive materials, such as copper, ruthenium, or cobalt. Etch stop layers (not shown) may be provided between dielectric layers in the BEOL region 240 to facilitate formation of single damascene structures 246 and dual damascene structures 248 in the BEOL region 240.

As indicated above, FIG. 2 is provided as an example. Other examples may differ from what is described with regard to FIG. 2.

Figure 3:
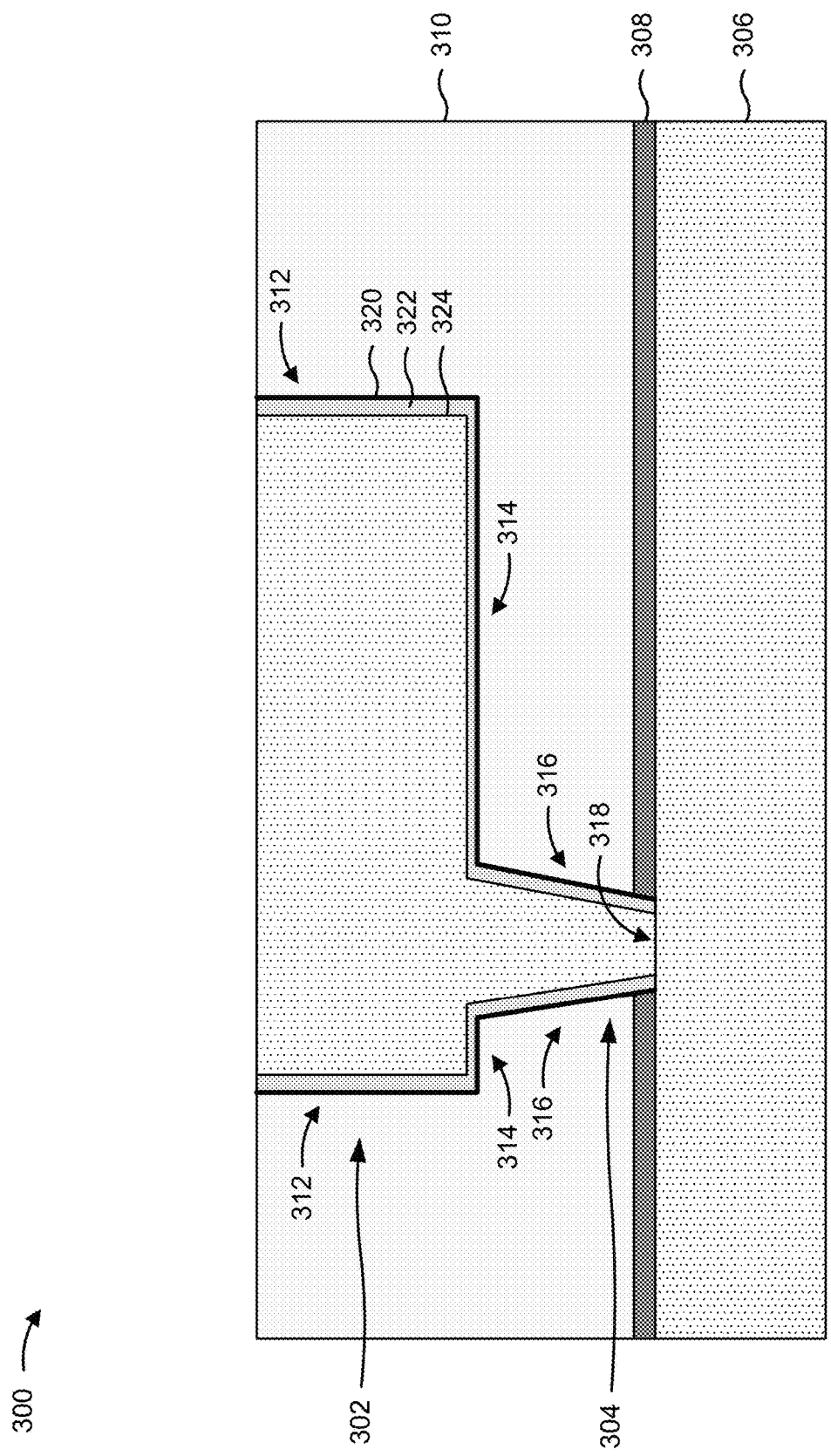
FIG. 3 is a diagram of an example dual damascene structure described herein.

FIG. 3 is a diagram of an example dual damascene structure 300 described herein. The dual damascene structure 300 may be an example of a dual damascene structure 248 that may be included in a device 200. The dual damascene structure 300 may include a trench 302 and a via 304.

The via 304 may connect to a lower metallization layer 306, which may be formed of copper, cobalt, or another type of metallic material. The lower metallization layer 306 may include a trench of another dual damascene structure in the BEOL region 240 of the device 200, a via of a single damascene structure in the BEOL region 240, a contact plug in the MEOL region 230 of the device 200, or another type of interconnect. An etch stop layer 308 may be provided between the lower metallization layer 306 and a dielectric layer 310 above the lower metallization layer 306 to facilitate formation of the dual damascene structure 300.

The dual damascene structure 300 may be formed in the dielectric layer 310 and through the etch stop layer 308. The trench 302 may include sidewalls 312 and a bottom surface 314. The via 304 may also include sidewalls 316 and a bottom surface 318. The sidewalls 312, the bottom surface 314, and the sidewalls 316 may include portions of the dielectric layer 310 surrounding the dual damascene structure 300.

The bottom surface 318 of the via 304 may include a portion of the lower metallization layer 306 under the via 304. In some implementations, the via 304 is a circuit via. In these implementations, a width of the bottom surface 318 of the via 304 may be in a range of approximately 10 nanometers (nm) to approximately 22 nm. In some implementations, the via 304 is a seal ring via. In these implementations, the width of the bottom surface 318 of the via 304 may be in a range of approximately 100 nm to approximately 180 nm.

A ruthenium oxide ($RuO_x$) film 320 may be included on the sidewalls 312, the bottom surface 314, and the sidewalls 316 of the dual damascene structure 300. The ruthenium oxide film 320 may promote adhesion between the surrounding dielectric layer 310 and a ruthenium liner 322 included over the sidewalls 312, the bottom surface 314, and the sidewalls 316 of the dual damascene structure 300 and on the ruthenium oxide film 320. In this way, the ruthenium oxide film 320 reduces and/or prevents the formation of discontinuities in the ruthenium liner 322 during deposition of the ruthenium liner 322. A thickness of the ruthenium oxide film 320 on the sidewalls 312, on the bottom surface 314, and on the sidewalls 316 may be in a range of approximately 2 angstroms (to minimize or prevent discontinuities in the ruthenium oxide film 320) to approximately 5 angstroms (to achieve a low sheet resistance for the dual damascene structure 300).

The ruthenium liner 322 may function as a diffusion barrier for a copper (Cu) layer 324 that is filled in the dual damascene structure 300 (e.g., in the trench 302 and in the via 304) over the ruthenium liner 322. In this way, the ruthenium liner 322 reduces or prevents copper atoms from diffusing into the dielectric layer 310 and the layers beneath the dielectric layer 310. Moreover, the ruthenium liner 322 may decrease the overall resistivity of the dual damascene structure 300, as the sheet resistance of thin film ruthenium is lower than other copper diffusion barrier layers such as tantalum nitride (TaN). A thickness of the ruthenium liner 322 on the sidewalls 312, on the bottom surface 314, and on the sidewalls 316 may be in a range of approximately 10 angstroms (to provide a sufficient copper diffusion barrier) to approximately 35 angstroms (to achieve a low sheet resistance for the dual damascene structure 300).

In some implementations, the ruthenium oxide film 320 and the ruthenium liner 322 may be formed such that the ruthenium oxide film 320 and the ruthenium liner 322 are omitted from the bottom surface 318 of the via 304, as shown in the example in FIG. 3. In these implementations, the copper layer 324 is included directly on the bottom surface 318 of the via 304, which provides a low contact resistance for the dual damascene structure 300. In some implementations, a residual amount of the ruthenium liner 322 forms on the bottom surface 318 of the via 304 during formation of the ruthenium liner 322. In these implementations, the copper layer 324 is formed over the residual amount of the ruthenium liner 322 on the bottom surface 318 of the via 304. While the contact resistance of copper is lower than the contact resistance of ruthenium, the overall contact resistance of the via 304 remains relatively low, as the contact resistance of ruthenium is lower than other copper diffusion barrier layers such as tantalum nitride (TaN). In implementations where a residual amount of the ruthenium liner 322 is included on the bottom surface 318, a thickness of the ruthenium liner 322 on the bottom surface 318 may be less than 50% of the thickness of the ruthenium liner 322 on the sidewalls 316 of the via 304 to achieve a low contact resistance. For example, the thickness of the ruthenium liner 322 may be greater than 0 angstroms and less than approximately 8 angstroms to achieve a low contact resistance for the dual damascene structure 300.

As indicated above, FIG. 3 is provided as an example. Other examples may differ from what is described with regard to FIG. 3.

Figure 4A:
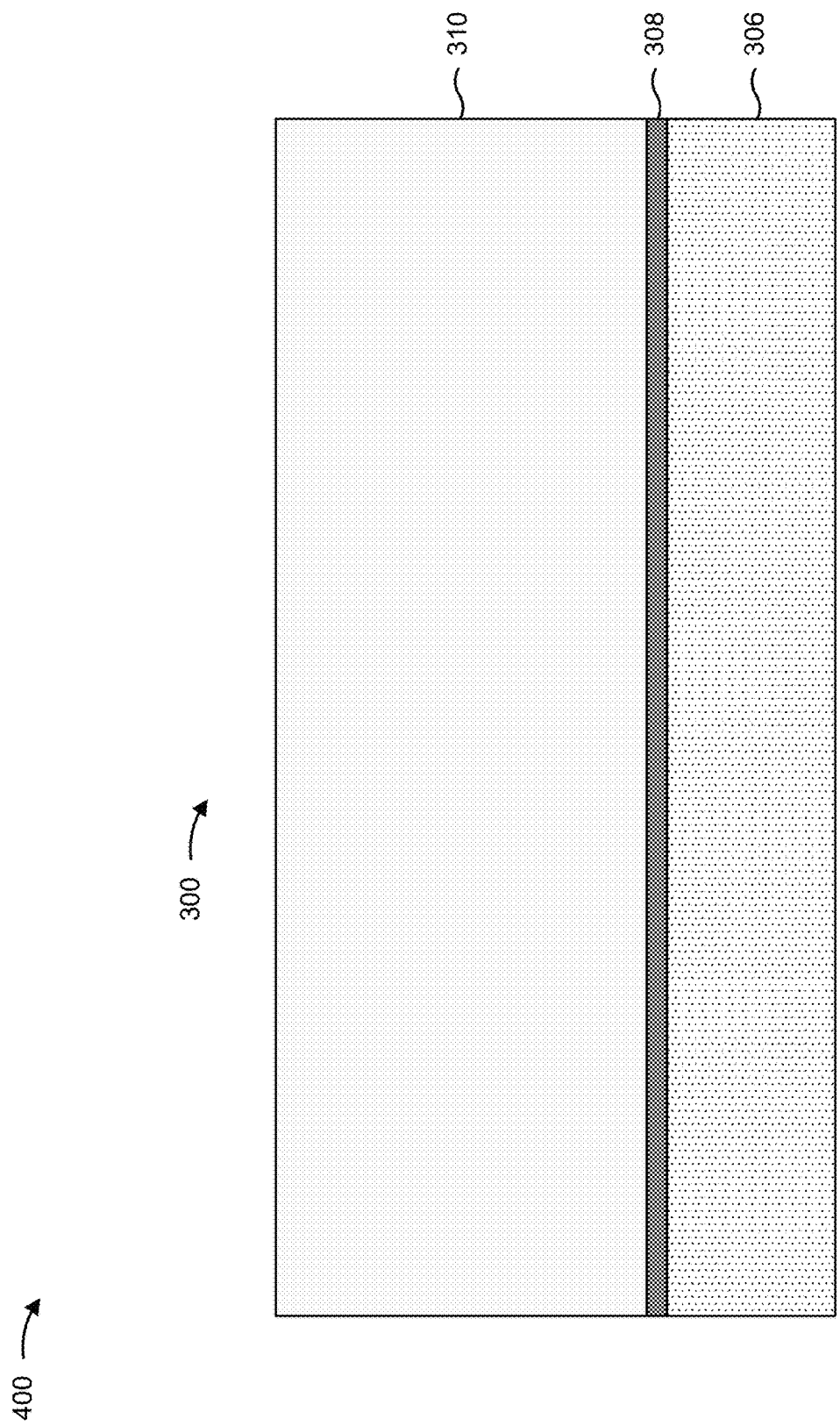
FIGS. 4A-4G are diagrams of an example implementation described herein.

FIGS. 4A-4G are diagrams of an example implementation 400 described herein. The example implementation 400 may be an example of forming the dual damascene structure 300 of FIG. 3. In some implementations, one or more of the semiconductor processing tools 102-116 perform one or more of the processes and/or operations described in connection with FIGS. 4A-4G. As shown in FIG. 4A, the dual damascene structure 300 may be formed in the dielectric layer 310 above the lower metallization layer 306. The etch stop layer 308 may be included between the dielectric layer 310 and the lower metallization layer 306 to facilitate the formation of the dual damascene structure 300 in the dielectric layer 310.

Figure 4B:
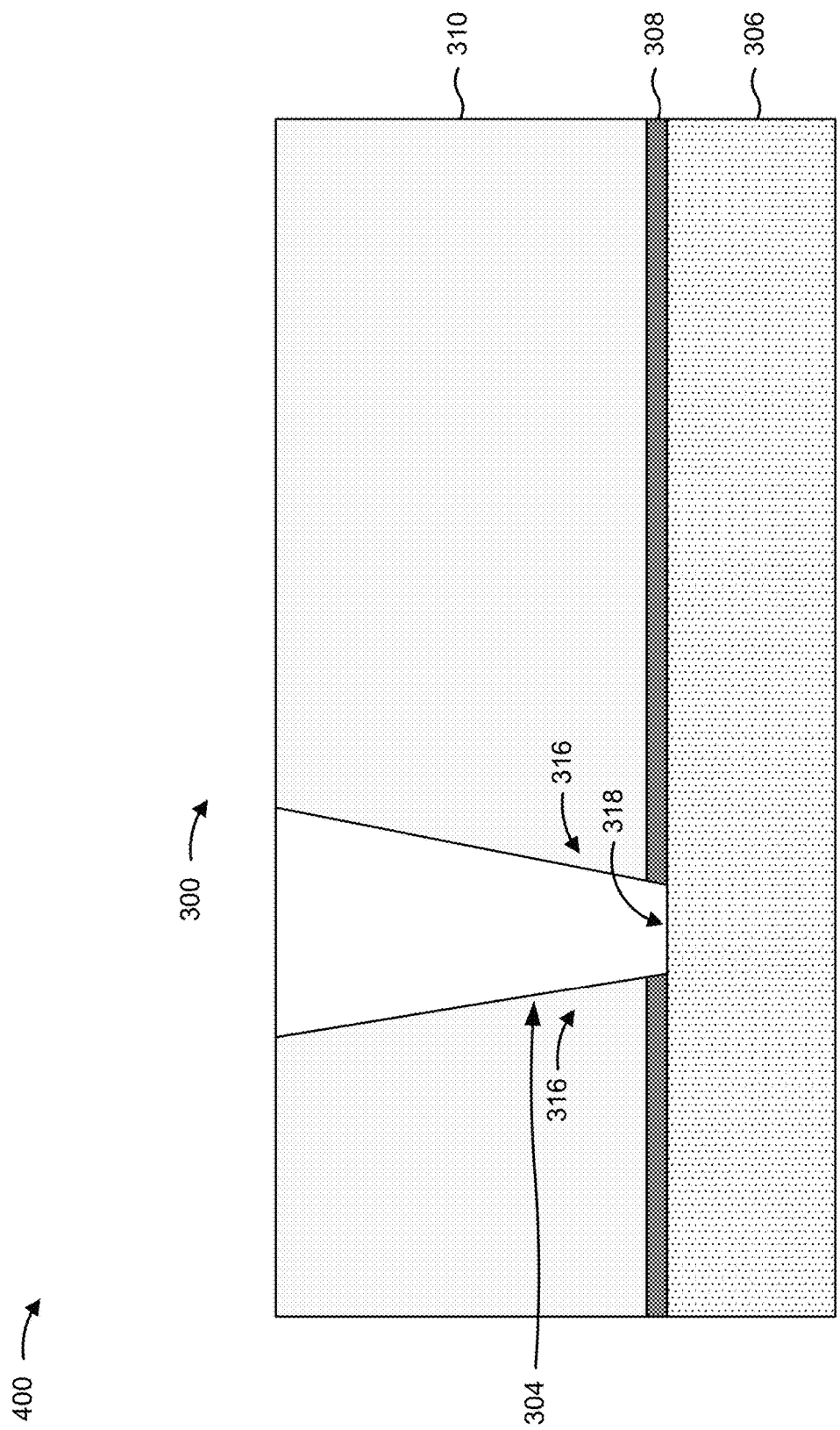

As shown in FIG. 4B, the via 304 may be formed in the dielectric layer 310. In particular, the via 304 may be formed from a top surface of the dielectric layer 310 through the dielectric layer 310. The via 304 may further be formed through the etch stop layer 308 and to the lower metallization layer 306. The deposition tool 102 may form a photoresist layer on the dielectric layer 310, the exposure tool 104 may expose the photoresist layer to a radiation source to pattern the photoresist layer, the developer tool 106 may develop and remove portions of the photoresist layer to expose the pattern, and the etch tool 108 may etch the dielectric layer 310 and the etch stop layer 308 to form the sidewalls 316 of the via 304 through the dielectric layer 310 and the etch stop layer 308. The via 304 may be etched to the lower metallization layer 306 such that the top surface of the lower metallization layer 306 is the bottom surface 318 of the via 304. In some implementations, a photoresist removal tool removes the remaining portions of the photoresist layer (e.g., using a chemical stripper and/or another technique).

Figure 4C:
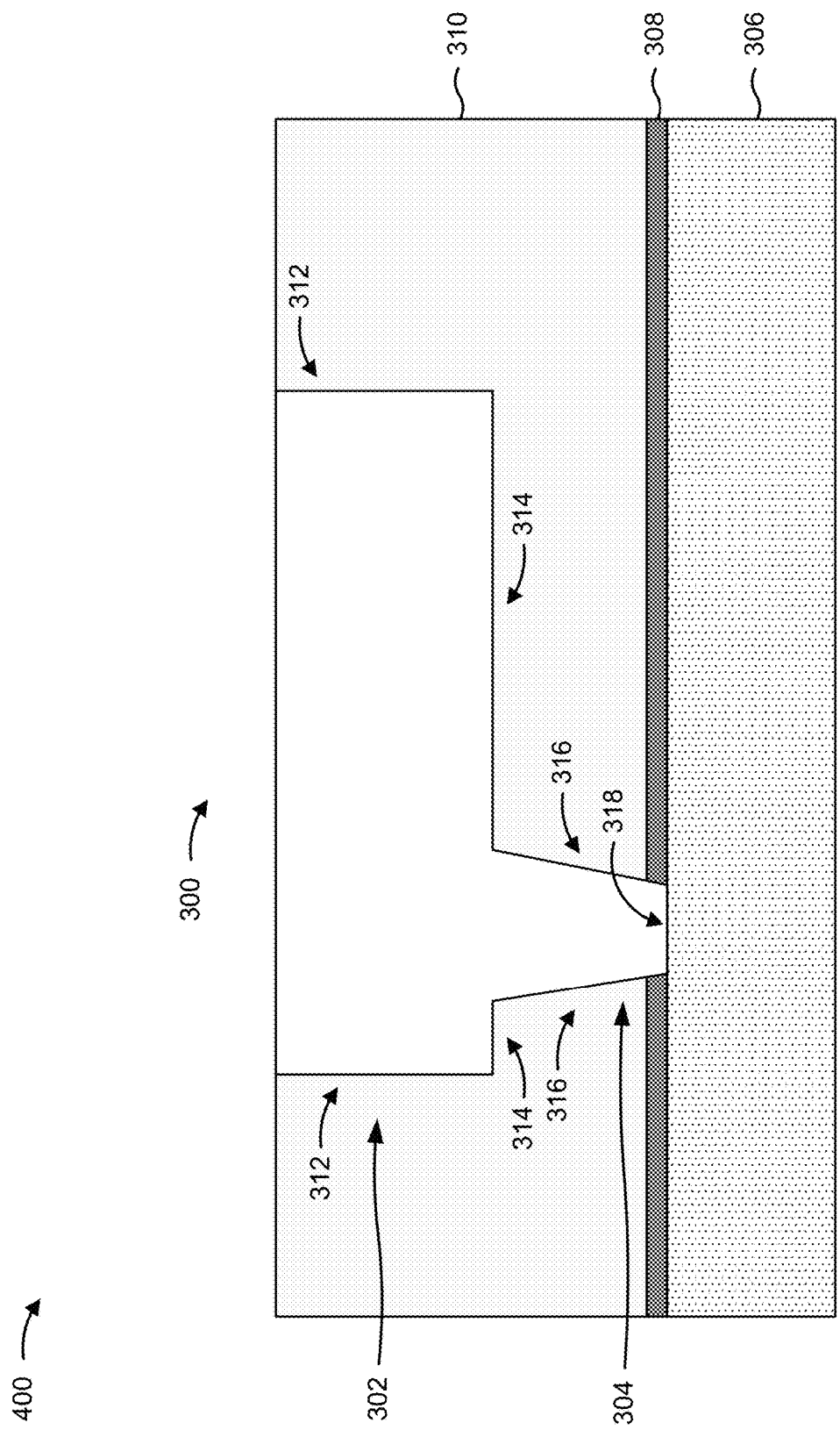

As shown in FIG. 4C, the trench 302 may be formed in the dielectric layer 310 above the via 304. In particular, the trench 302 may be formed from a top surface of the dielectric layer 310 and into a portion of the dielectric layer 310. The deposition tool 102 may form a photoresist layer on the dielectric layer 310, the exposure tool 104 may expose the photoresist layer to a radiation source to pattern the photoresist layer, the developer tool 106 may develop and remove portions of the photoresist layer to expose the pattern, and the etch tool 108 may etch the dielectric layer 310 to form the sidewalls 312 and the bottom surface 314 of the trench 302 in the dielectric layer 310. In some implementations, a photoresist removal tool removes the remaining portions of the photoresist layer (e.g., using a chemical stripper and/or another technique).

FIGS. 4B and 4C illustrate an example via-first dual damascene procedure in which the dual damascene structure 300 is formed by forming the via 304 before forming the trench 302. In some implementations, a trench-first dual damascene procedure in which the dual damascene structure 300 is formed by forming the trench 302 before forming the via 304 (or another type of dual damascene procedure) is performed to form the dual damascene structure 300.

Figure 4D:
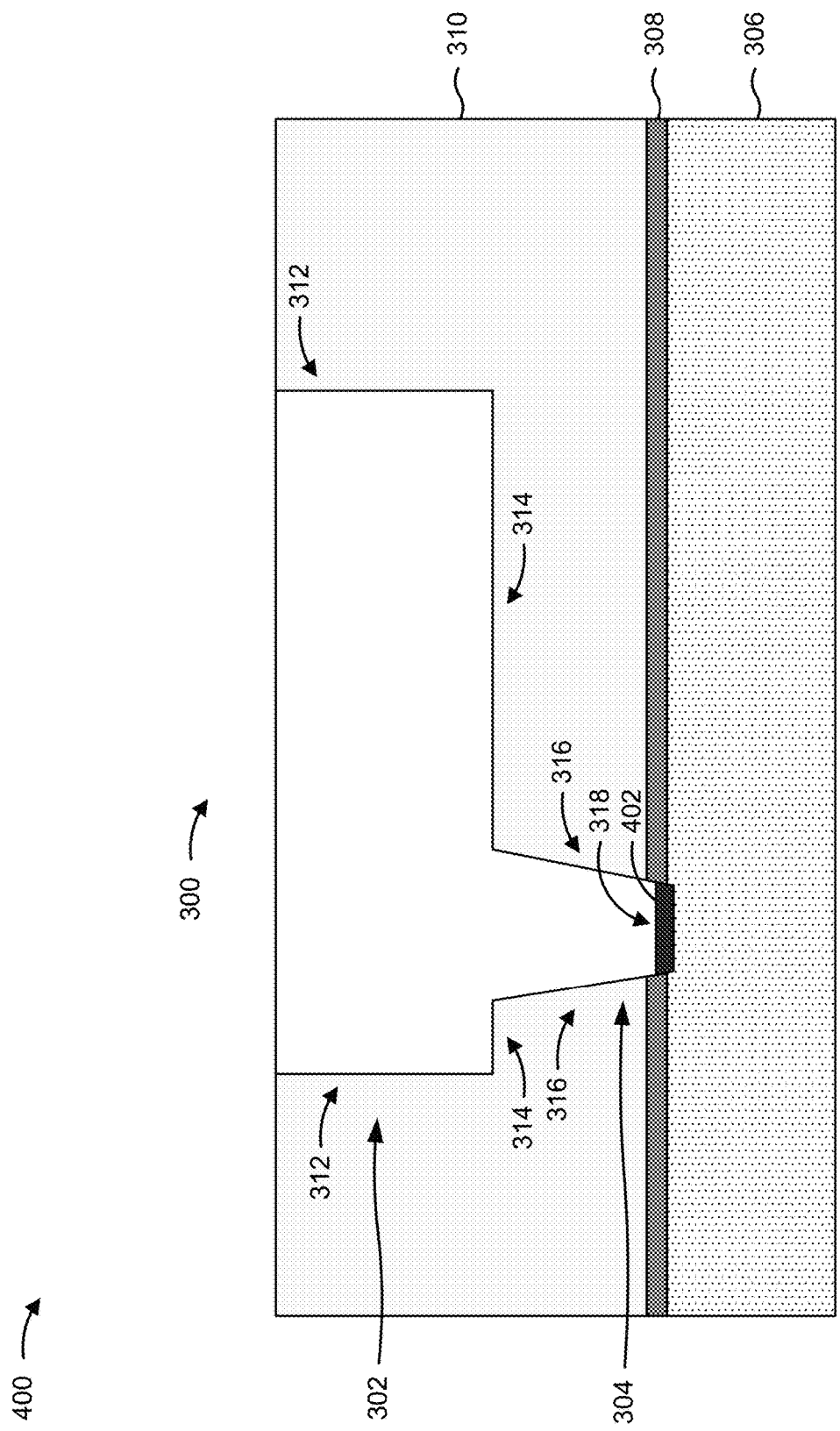

As shown in FIG. 4D, the bottom surface 318 of the via 304 may be modified to resist or prevent formation of the ruthenium liner 322 on the bottom surface 318. In particular, the pre-treatment tool 114 may perform a pre-treatment operation to cause the bottom surface 318 of the via 304 to become non-metallic. The pre-treatment operation may include immersing the bottom surface 318 of the via 304 in benzotriazole (BTA) for a time duration (e.g., 1-10 minutes) to cause a non-metallic passive layer 402 to form on the bottom surface 318. The bottom surface 318 may be soaked in the BTA, which causes a complex between the metal material (e.g., copper) of the lower metallization layer 306 and the BTA to form the passive layer 402. The copper-BTA complex in the passive layer 402 acts as a corrosion inhibitor, and prevents or blocks ruthenium precursors from being absorbed into the bottom surface 318 of the via 304 (e.g., the lower metallization layer 306).

Figure 4E:
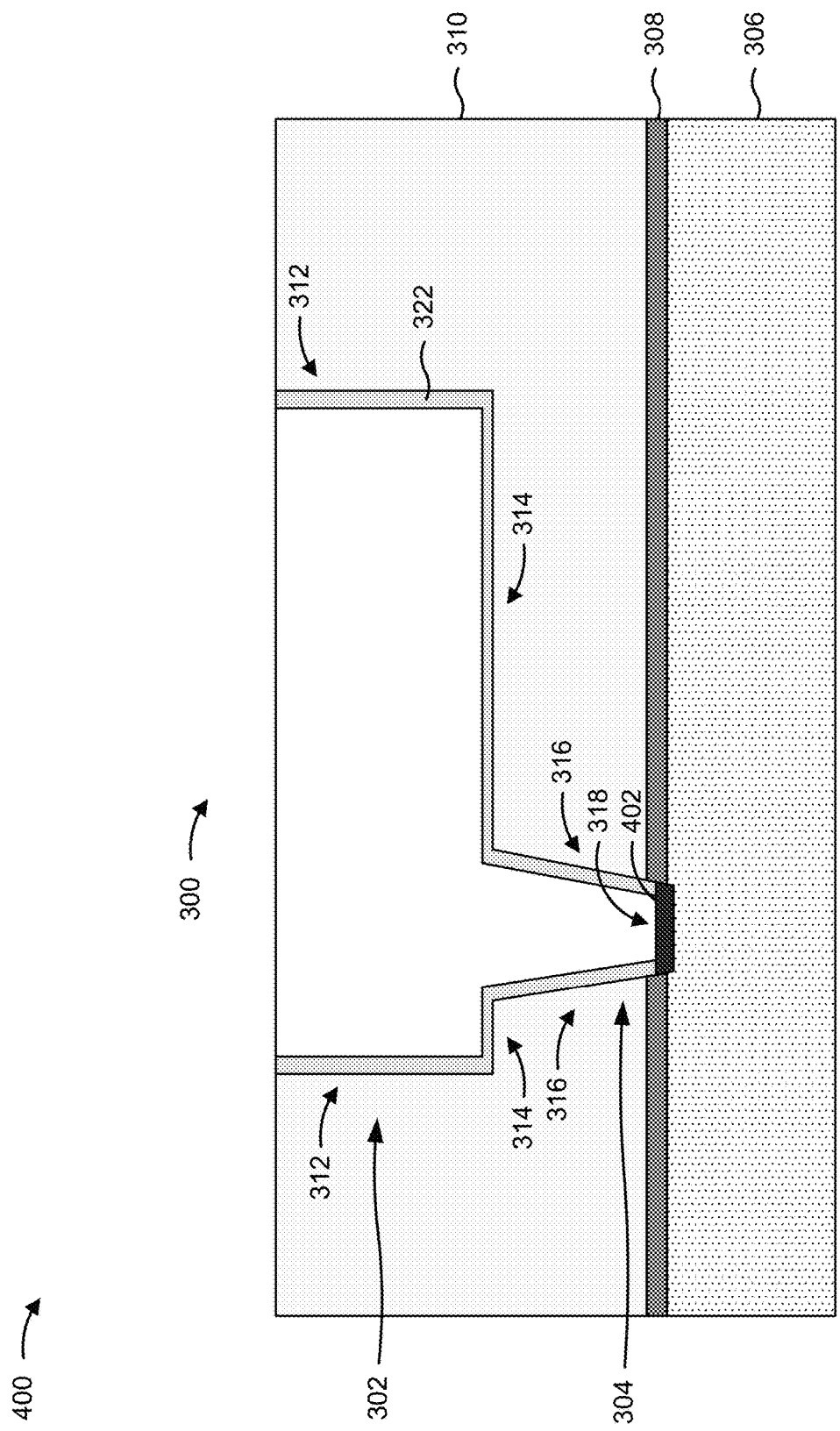

As shown in FIG. 4E, the ruthenium liner 322 may be formed on the sidewalls 312 and the bottom surface 314 of the trench 302, and on the sidewalls 316 of the via 304. The deposition tool 102 may deposit the ruthenium liner 322 on the sidewalls 312, on the bottom surface 314, and on the sidewalls 316 by performing an ALD operation or a CVD operation. The deposition tool 102 may form the ruthenium liner 322 to a thickness in a range of approximately 10 angstroms to approximately 35 angstroms.

As described above, the non-metallic passive layer 402 blocks or prevents ruthenium precursors from being absorbed in the lower metallization layer 306. Accordingly, the non-metallic passive layer 402 may block or prevent the ruthenium liner 322 from being deposited on the bottom surface 318 of the via 304. In some implementations, a residual amount of the ruthenium liner 322 (e.g., less than approximately 8 angstroms) is formed on the bottom surface 318.

Figure 4F:
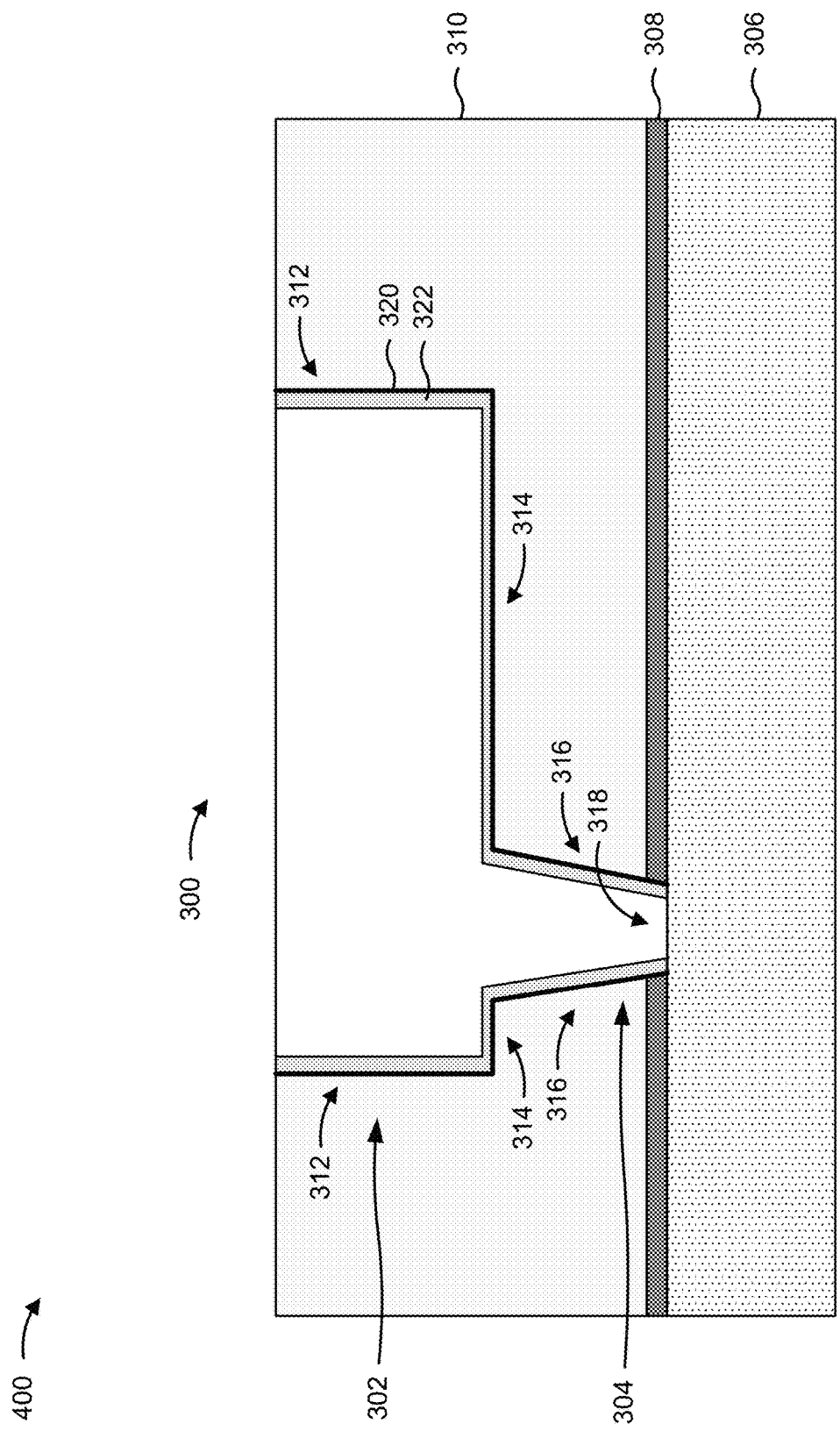

As shown in FIG. 4F, the passive layer 402 may be removed from the bottom surface 318 of the via 304 after formation of the ruthenium liner 322. The plasma tool 116 may perform a plasma treatment operation to remove the passive layer 402 from the bottom surface 318 using an ammonia-based plasma, an oxygen-based plasma, a hydrogen-based plasma, or a plasma including another type of ions. For example, the plasma tool 116 may bombard the passive layer 402 with ammonia ions, oxygen ions, or another type of ions to sputter etch the passive layer 402 off the bottom surface 318, which causes the bottom surface 318 to become metallic again. An anneal may be performed to vaporize the removed material of the passive layer 402, and the vaporized material may be vacuumed from a processing chamber of the plasma tool 116. Returning the metallic properties to the bottom surface 318 of the via 304 promotes metal-to-metal adhesion between the copper or cobalt of the bottom surface 318 and the copper layer 324 that is to be filled in the dual damascene structure 300, which minimizes or prevents the formation of voids and other defects in the copper layer 324.

During the plasma treatment operation, plasma may penetrate through the ruthenium liner 322 on the sidewalls 312, the bottom surface 314, and the sidewalls 316 to the surrounding dielectric layer 310. The plasma may react with the low-k dielectric material of the dielectric layer 310, which causes surface carbon to be removed from the dielectric layer 310. As a result, the sidewalls 312, the bottom surface 314, and the sidewalls 316 become rich in silicon dioxide ($SiO_2$). The oxygen in the silicon dioxide readily bonds with the ruthenium in the ruthenium liner 322 on the sidewalls 312, the bottom surface 314, and the sidewalls 316 to self-form the ruthenium oxide film 320 directly on the sidewalls 312, the bottom surface 314, and the sidewalls 316 between the dielectric layer 310 and the ruthenium liner 322. This self-formation of the ruthenium oxide film 320 promotes adhesion between the dielectric layer 310 and the ruthenium liner 322, which helps to minimize or prevent the formation of discontinuities in the ruthenium liner 322.

Figure 4G:
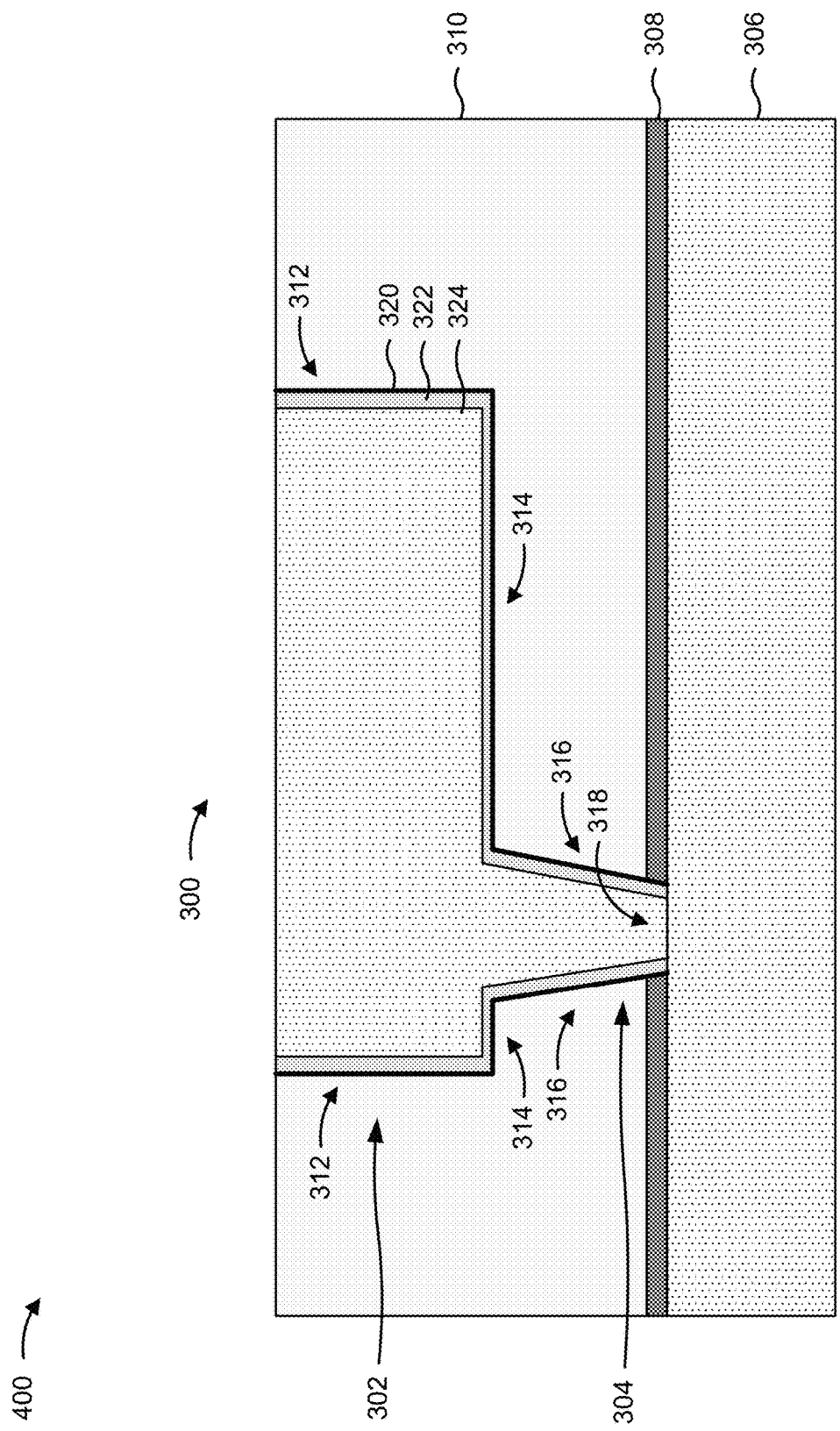

As shown in FIG. 4G, the copper layer 324 may be formed in the remaining volume of the dual damascene structure 300 (e.g., in the via 304 and the trench 302) such that the dual damascene structure 300 is filled with copper. In some implementations, the plating tool 112 performs a plating operation (e.g., an electroplating operation or an electroless plating operation) to cause copper to grow the copper layer 324 over the ruthenium liner 322 in the via 304 and in the trench 302. In some implementations, the deposition tool 102 performs a PVD operation to deposit a copper seed layer on the ruthenium liner 322, and the plating tool 112 performs the plating operation to form the copper layer 324 on the copper seed layer. In some implementations, a reflow operation is performed before or after the plating operation. The reflow operation may include heating the copper layer 324 (e.g., to 400 degrees Celsius or higher) to permit the copper layer 324 to flow. This permits the copper layer 324 to fill any voids or eliminate any material islands that may have been formed during the plating operation. In some implementations, the dual damascene structure 300 is heated during the plating operation such that the reflow operation and the plating operation are performed simultaneously. In some implementations, multiple plating operations and/or multiple reflow operations may be performed to fill the dual damascene structure 300 with the copper layer 324. The planarization tool 110 may perform a CMP operation to planarize the copper layer 324 after the plating operation and after the reflow operation.

As indicated above, FIGS. 4A-4G are provided as an example. Other examples may differ from what is described with regard to FIGS. 4A-4G. In some implementations, the process techniques described in connection with FIGS. 4A-4G may be used to form a single damascene structure, such as a via in an M0 BEOL metallization layer (e.g., the metallization layer closest to the MEOL region 230) over a contact plug. In these implementations, the sidewalls 316 and the bottom surface 318 of the via 304 may be formed in the dielectric layer 310, the bottom surface 318 may be modified to become non-metallic as described above, the ruthenium liner 322 may be deposited on the sidewalls 316 of the via 304, the bottom surface 318 may be recovered to become metallic after formation of the ruthenium liner 322 (which includes the formation of the ruthenium oxide film 320), and the via 304 may be filled with the copper layer 324 over the ruthenium liner 322. The modification of the bottom surface 318 results in a bottom-less ruthenium liner 322 on the contact plug, while providing no ruthenium liner selectivity on the dielectric layer 310.

Figure 5:
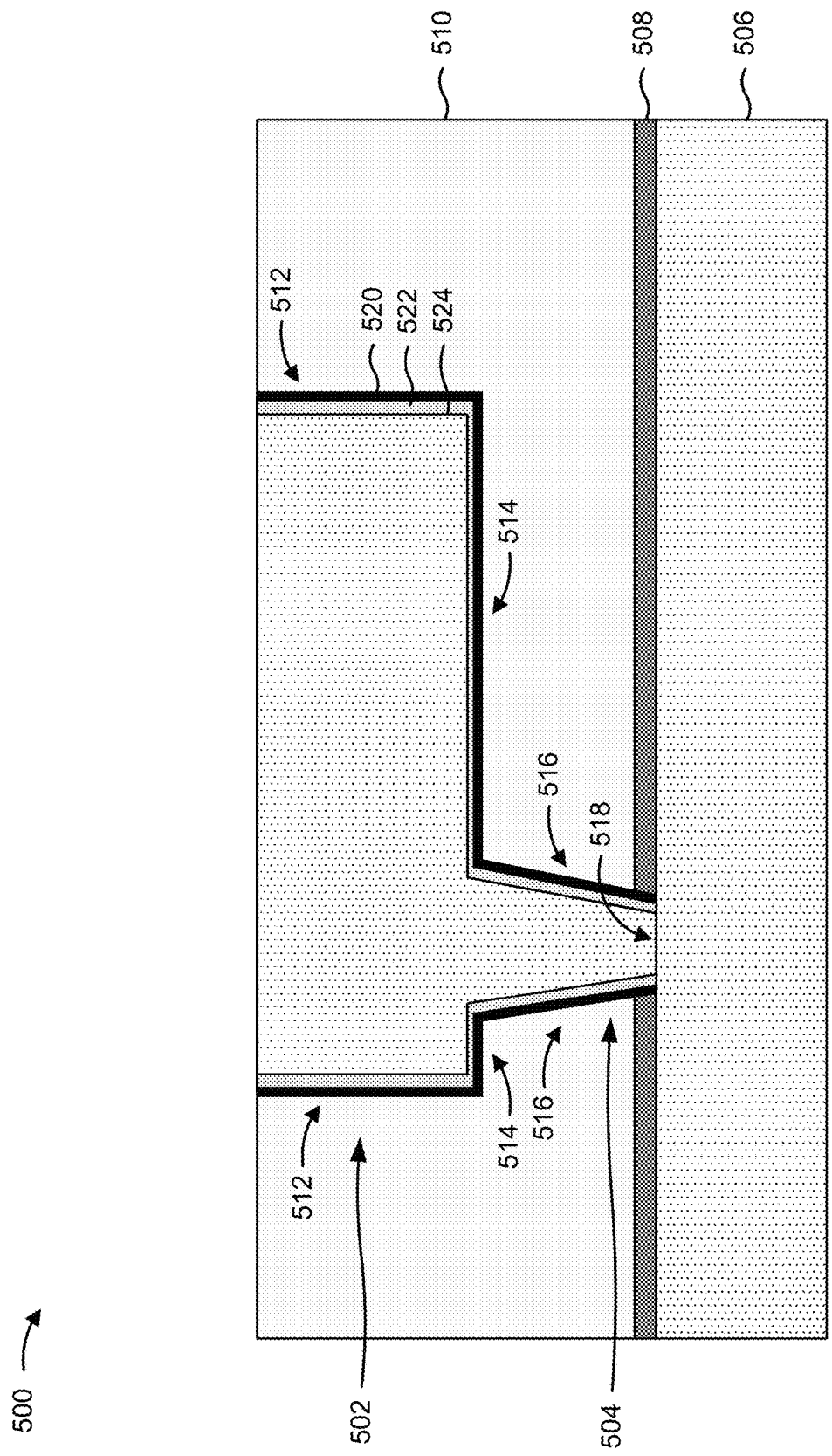
FIG. 5 is a diagram of an example dual damascene structure described herein.

FIG. 5 is a diagram of an example dual damascene structure 500 described herein. The dual damascene structure 500 may be an example of a dual damascene structure 248 that may be included in a device 200. The dual damascene structure 500 may include a trench 502 and a via 504. The via 504 may connect to a lower metallization layer 506, which may be formed of copper, cobalt, or another type of metallic material. The lower metallization layer 506 may include a trench of another dual damascene structure in the BEOL region 240 of the device 200, a via of a single damascene structure in the BEOL region 240, a contact plug in the MEOL region 230 of the device 200, or another type of interconnect. An etch stop layer 508 may be provided between the lower metallization layer 506 and a dielectric layer 510 above the lower metallization layer 506 to facilitate formation of the dual damascene structure 500.

The dual damascene structure 500 may be formed in the dielectric layer 510 and through the etch stop layer 508. The trench 502 may include sidewalls 512 and a bottom surface 514. The via 504 may also include sidewalls 516 and a bottom surface 518. The sidewalls 512, the bottom surface 514, and the sidewalls 516 may include portions of the dielectric layer 510 surrounding the dual damascene structure 500.

The bottom surface 518 of the via 504 may include a portion of the lower metallization layer 506 under the via 504. In some implementations, the via 504 is a circuit via. In these implementations, a width of the bottom surface 518 of the via 504 may be in a range of approximately 8 nm to approximately 12 nm for an M0 layer via or approximately 10 nm to approximately 22 nm for an M1-M3 layer via (e.g., the metallization layers above the M0 layer). In some implementations, the via 504 is a seal ring via. In these implementations, the width of the bottom surface 518 of the via 504 may be in a range of approximately 100 nm to approximately 180 nm.

A ruthenium oxide ($RuO_x$) film 520 may be included on the sidewalls 512, the bottom surface 514, and the sidewalls 516 of the dual damascene structure 500. The ruthenium oxide film 520 may promote adhesion between the surrounding dielectric layer 510 and a ruthenium liner 522 included over the sidewalls 512, the bottom surface 514, and the sidewalls 516 of the dual damascene structure 500 and on the ruthenium oxide film 520. In this way, the ruthenium oxide film 520 reduces and/or prevents the formation of discontinuities in the ruthenium liner 522 during deposition of the ruthenium liner 522. A thickness of the ruthenium oxide film 520 on the sidewalls 512, on the bottom surface 514, and on the sidewalls 516 may be in a range of approximately 5 angstroms (to minimize or prevent discontinuities in the ruthenium oxide film 520) to approximately 10 angstroms (to achieve a low sheet resistance for the dual damascene structure 500).

The ruthenium liner 522 may function as a diffusion barrier for a copper (Cu) layer 524 that is filled in the dual damascene structure 500 (e.g., in the trench 502 and in the via 504) over the ruthenium liner 522. In this way, the ruthenium liner 522 reduces or prevents copper atoms from diffusing into the dielectric layer 510 and the layers beneath the dielectric layer 510. Moreover, the ruthenium liner 522 may decrease the overall resistivity of the dual damascene structure 500, as the sheet resistance of thin film ruthenium is lower than other copper diffusion barrier layers such as tantalum nitride (TaN). A thickness of the ruthenium liner 522 on the sidewalls 512, on the bottom surface 514, and on the sidewalls 516 may be in a range of approximately 5 angstroms (to provide a sufficient copper diffusion barrier) to approximately 25 angstroms (to achieve a low sheet resistance for the dual damascene structure 500).

In some implementations, the ruthenium oxide film 520 and the ruthenium liner 522 may be formed such that the ruthenium oxide film 520 and the ruthenium liner 522 are omitted from the bottom surface 518 of the via 504, as shown in the example in FIG. 5. In these implementations, the copper layer 524 is included directly on the bottom surface 518 of the via 504, which provides a low contact resistance for the dual damascene structure 500. In some implementations, a residual amount of the ruthenium oxide film 520 forms over the bottom surface 518 of the via 504 during formation of the ruthenium oxide film 520, and a residual amount of the ruthenium liner 522 forms over the bottom surface 518 during formation of the ruthenium liner 522. In these implementations, the copper layer 524 is formed over the residual amount of the ruthenium oxide film 520 and the residual amount of the ruthenium line 522 over the bottom surface 518 of the via 504. While the contact resistance of copper is lower than the contact resistance of ruthenium, the overall contact resistance of the via 504 remains relatively low, as the residual amount of ruthenium oxide is small and the contact resistance of ruthenium is lower than other copper diffusion barrier layers such as tantalum nitride (TaN).

In implementations where a residual amount of the ruthenium liner 522 is included over the bottom surface 518, a thickness of the ruthenium liner 522 on the bottom surface 518 may be less than 50% of the thickness of the ruthenium liner 522 over the sidewalls 516 of the via 504 to achieve a low contact resistance. For example, the thickness of the ruthenium liner 522 may be greater than 0 angstroms and less than approximately 10 angstroms to achieve a low contact resistance for the dual damascene structure 500. In implementations where a residual amount of the ruthenium oxide film 520 is included over the bottom surface 518, a thickness of the ruthenium oxide film 520 over the bottom surface 518 may be greater than 0 angstroms and less than approximately 3 angstroms to minimize the impact of the ruthenium oxide on the contact resistance of the dual damascene structure 500.

As indicated above, FIG. 5 is provided as an example. Other examples may differ from what is described with regard to FIG. 5.

Figure 6A:
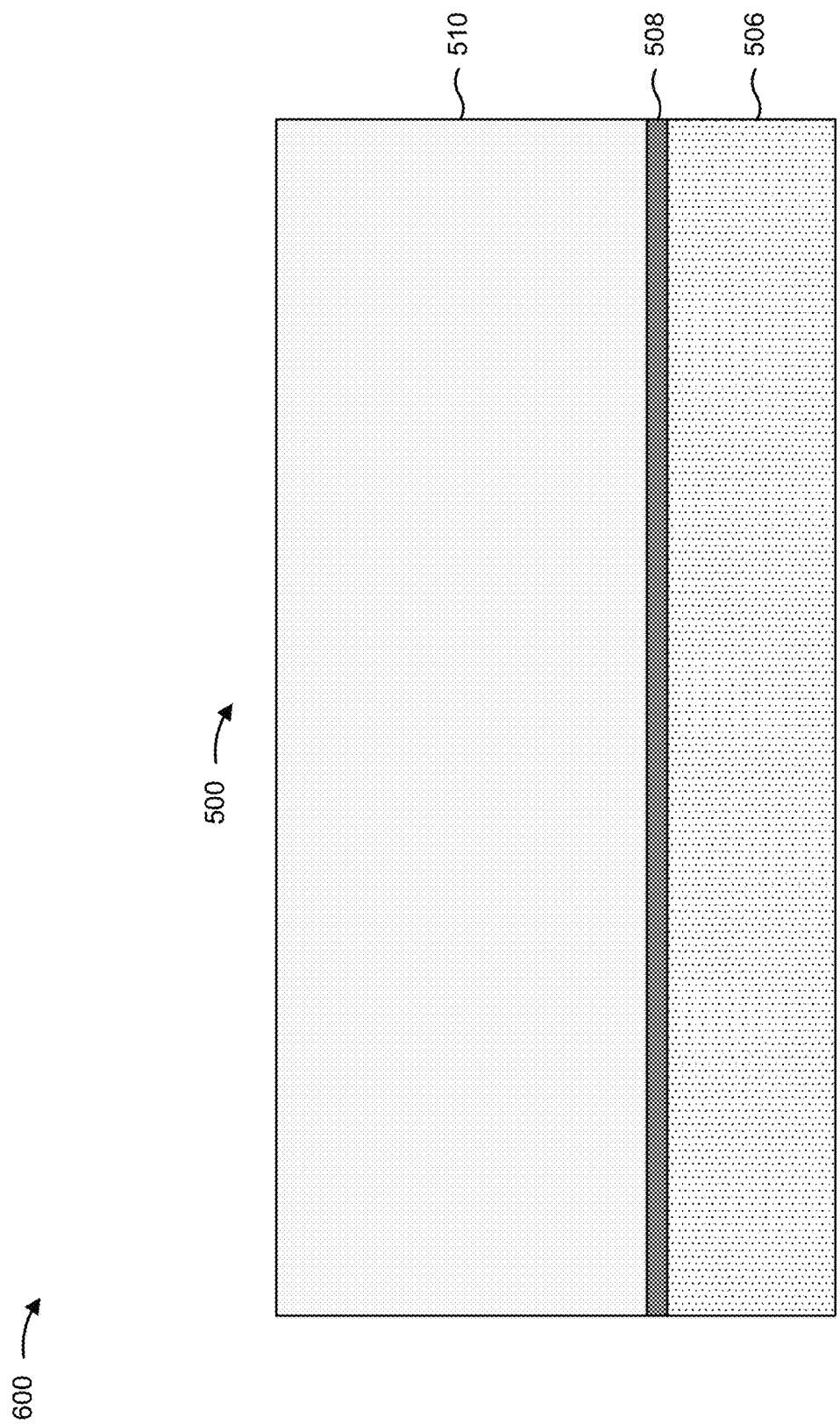
FIGS. 6A-6H are diagrams of an example implementation described herein.

FIGS. 6A-6H are diagrams of an example implementation 600 described herein. The example implementation 600 may be an example of forming the dual damascene structure 500 of FIG. 5. In some implementations, one or more of the semiconductor processing tools 102-116 perform one or more of the processes and/or operations described in connection with FIGS. 6A-6H. As shown in FIG. 6A, the dual damascene structure 500 may be formed in the dielectric layer 510 above the lower metallization layer 506. The etch stop layer 508 may be included between the dielectric layer 510 and the lower metallization layer 506 to facilitate the formation of the dual damascene structure 500 in the dielectric layer 510.

Figure 6B:
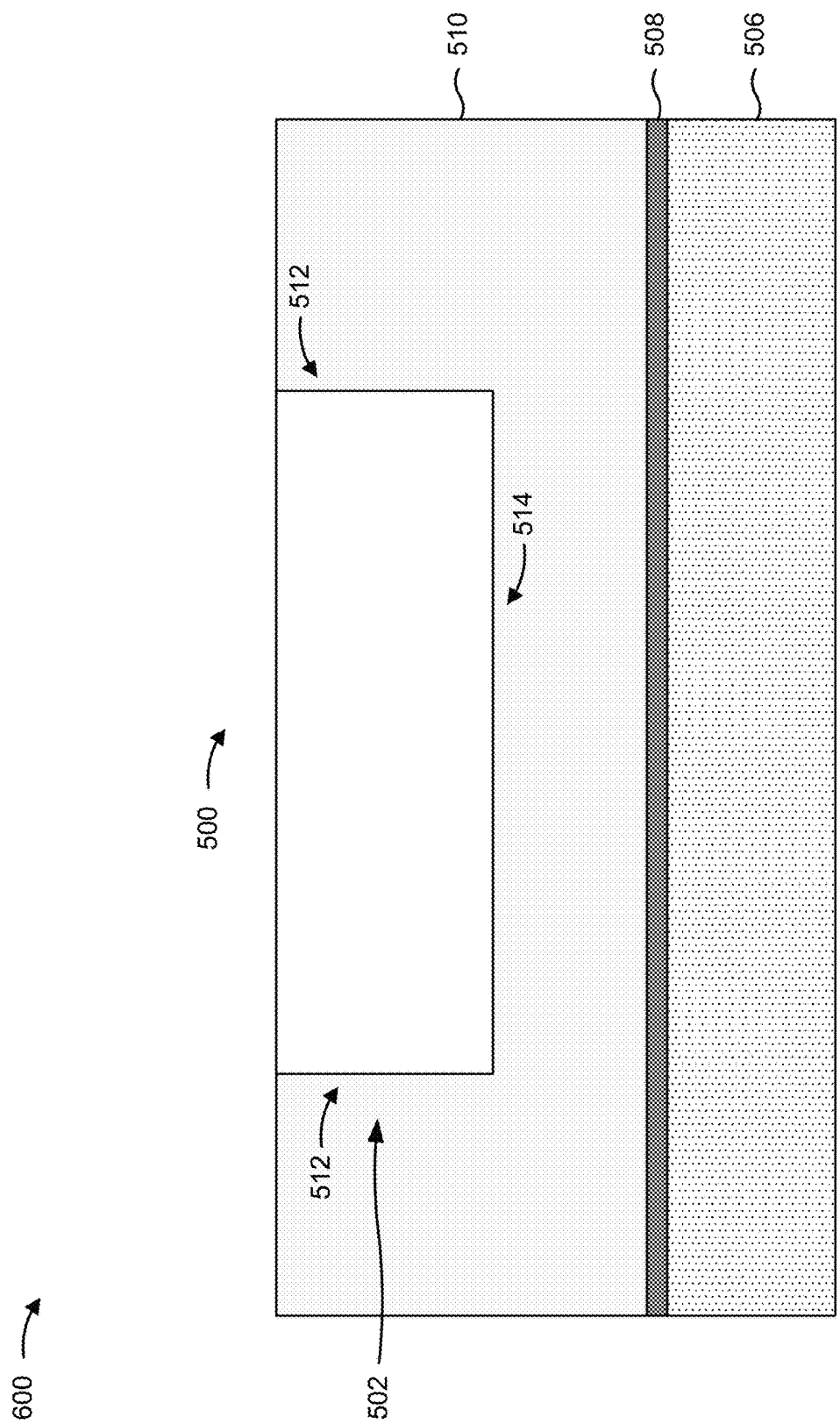

As shown in FIG. 6B, the trench 502 may be formed in the dielectric layer 510. In particular, the trench 502 may be formed from a top surface of the dielectric layer 510 and into a portion of the dielectric layer 510. The deposition tool 102 may form a photoresist layer on the dielectric layer 510, the exposure tool 104 may expose the photoresist layer to a radiation source to pattern the photoresist layer, the developer tool 106 may develop and remove portions of the photoresist layer to expose the pattern, and the etch tool 108 may etch the dielectric layer 510 to form the sidewalls 512 and the bottom surface 514 of the trench 502 in the dielectric layer 510. In some implementations, a photoresist removal tool removes the remaining portions of the photoresist layer (e.g., using a chemical stripper and/or another technique).

Figure 6C:
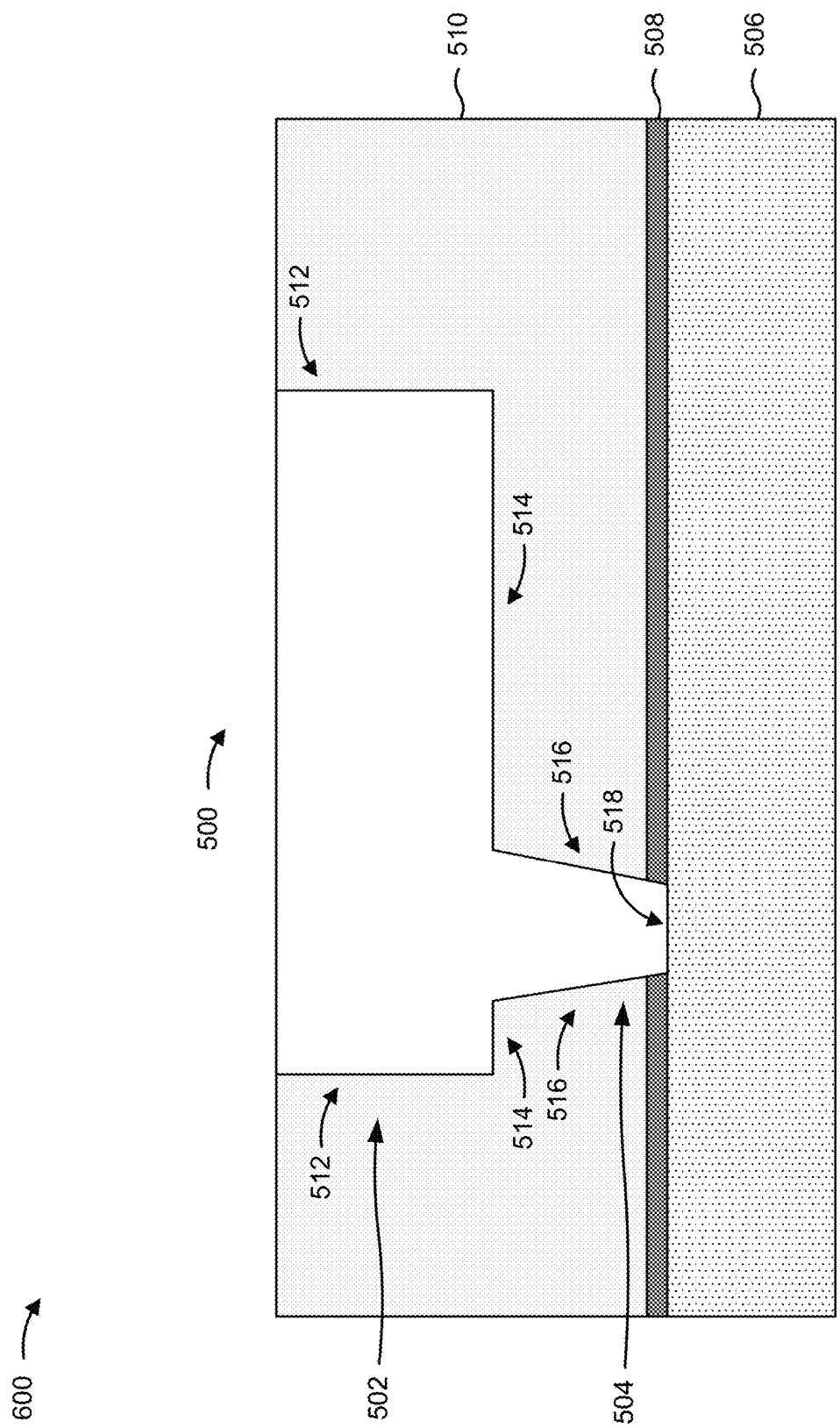

As shown in FIG. 6C, the via 504 may be formed in the dielectric layer 510 in a portion of the bottom surface 514 of the trench 502. In particular, the via 504 may be formed from the bottom surface 514 of the trench 502 in the dielectric layer 510 and through the dielectric layer 510. The via 504 may further be formed through the etch stop layer 508 and to the lower metallization layer 506. The deposition tool 102 may form a photoresist layer on the dielectric layer 510, the exposure tool 104 may expose the photoresist layer to a radiation source to pattern the photoresist layer, the developer tool 106 may develop and remove portions of the photoresist layer to expose the pattern, and the etch tool 108 may etch the dielectric layer 510 and the etch stop layer 508 to form the sidewalls 516 of the via 504 through the dielectric layer 510 and the etch stop layer 508. The via 504 may be etched to the lower metallization layer 506 such that the top surface of the lower metallization layer 506 is the bottom surface 518 of the via 504. In some implementations, a photoresist removal tool removes the remaining portions of the photoresist layer (e.g., using a chemical stripper and/or another technique).

FIGS. 6B and 6C illustrate an example trench-first dual damascene procedure in which the dual damascene structure 500 is formed by forming the trench 502 before forming the via 504. In some implementations, a via-first dual damascene procedure in which the dual damascene structure 500 is formed by forming the via 504 before forming the trench 502 (or another type of dual damascene procedure) is performed to form the dual damascene structure 500.

Figure 6D:
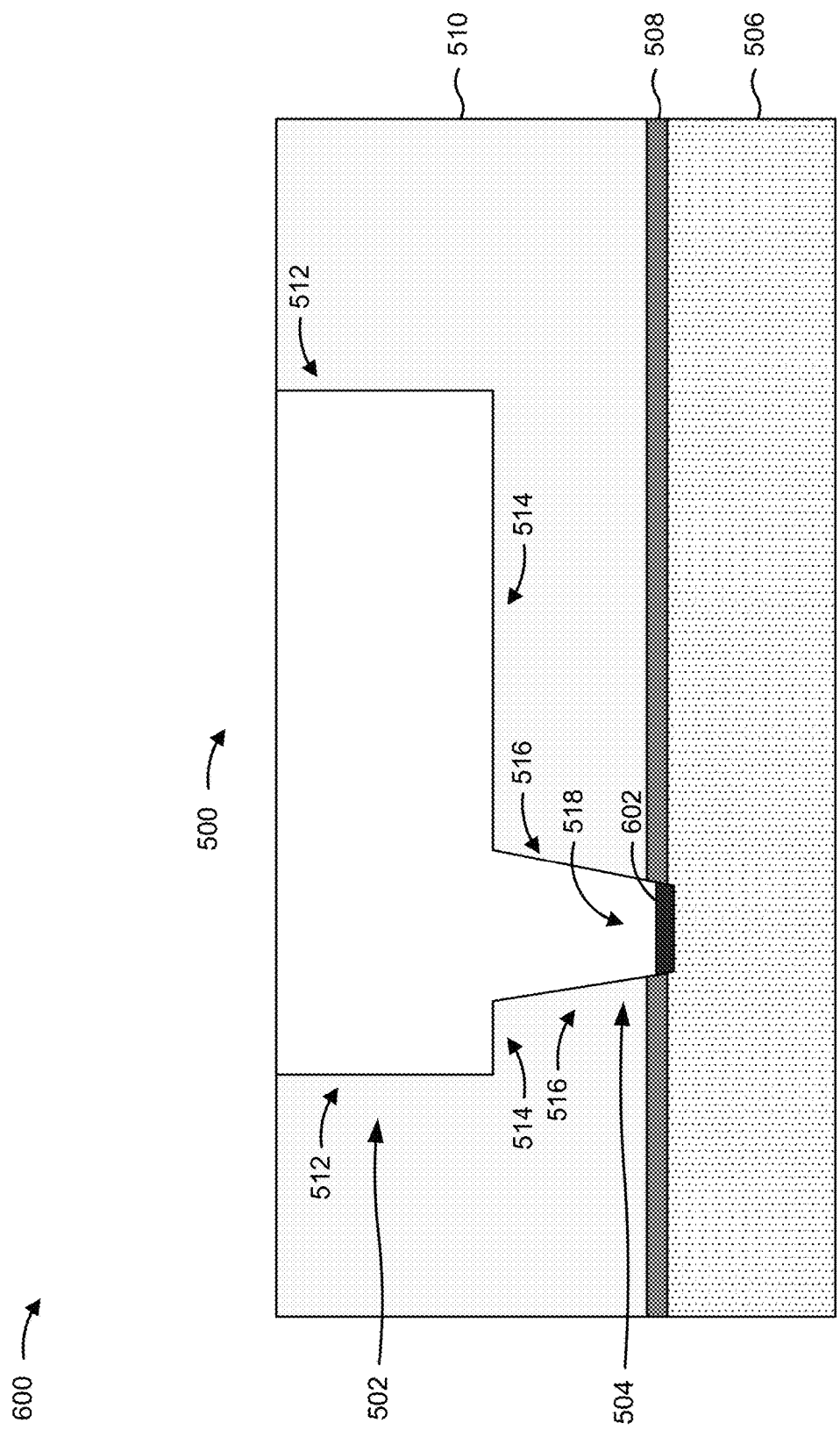

As shown in FIG. 6D, the bottom surface 518 of the via 504 may be modified to resist or prevent formation of the ruthenium liner 522 on the bottom surface 518. In particular, the pre-treatment tool 114 may perform a pre-treatment operation to cause the bottom surface 518 of the via 504 to become non-metallic. The pre-treatment operation may include immersing the bottom surface 518 of the via 504 in benzotriazole (BTA) for a time duration to cause a non-metallic passive layer 602 to form on the bottom surface 518. The bottom surface 518 may be soaked in the BTA, which causes a complex between the metal material (e.g., copper) of the lower metallization layer 506 and the BTA to form the passive layer 602. The copper-BTA complex in the passive layer 602 acts as a corrosion inhibitor, and prevents or blocks ruthenium precursors from being absorbed into the bottom surface 518 of the via 504 (e.g., the lower metallization layer 506).

Figure 6E:
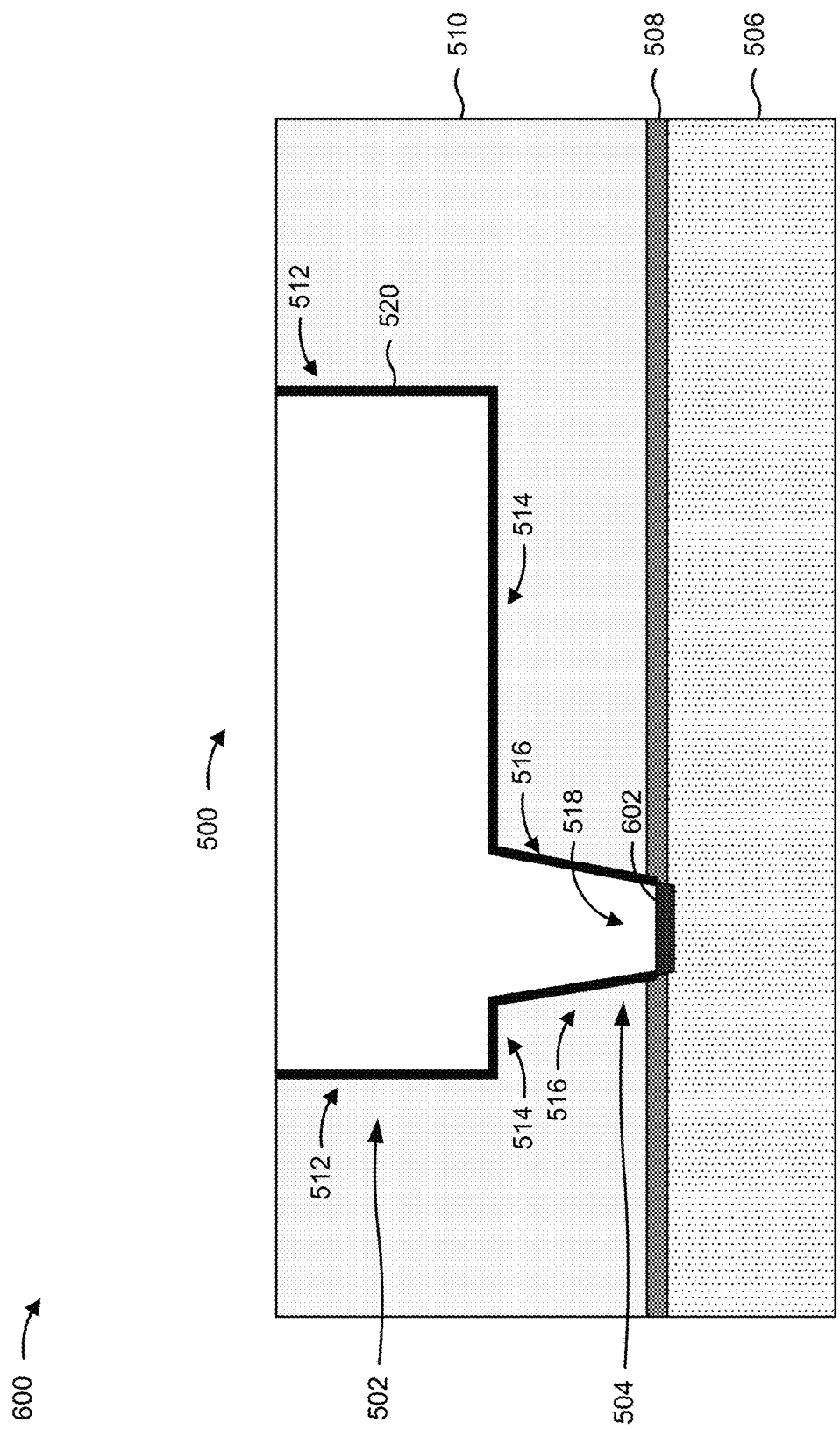

As shown in FIG. 6E, the ruthenium oxide film 520 may be formed on the sidewalls 512 and the bottom surface 514 of the trench 502, and on the sidewalls 516 of the via 504. The deposition tool 102 may deposit the ruthenium oxide film 520 directly onto the sidewalls 512, on the bottom surface 514, and on the sidewalls 516 by performing an ALD operation or a CVD operation. The deposition tool 102 may form the ruthenium oxide film 520 to a thickness in a range of approximately 5 angstroms to approximately 10 angstroms on the sidewalls 512, on the bottom surface 514, and on the sidewalls 516. The ruthenium oxide film 520 may be deposited on the sidewalls 512, on the bottom surface 514, and on the sidewalls 516 to have precise control over the formation of the ruthenium oxide film 520 and to minimize variation in the thickness of the ruthenium oxide film 520.

As described above, the non-metallic passive layer 602 blocks or prevents ruthenium precursors from being absorbed in the lower metallization layer 506. Accordingly, the non-metallic passive layer 602 may block or prevent the ruthenium precursors in the ruthenium oxide film 520 from being absorbed into the bottom surface 518 of the via 504. In some implementations, a residual amount of the ruthenium oxide film 520 (e.g., less than approximately 3 angstroms) is formed over the bottom surface 518.

Figure 6F:
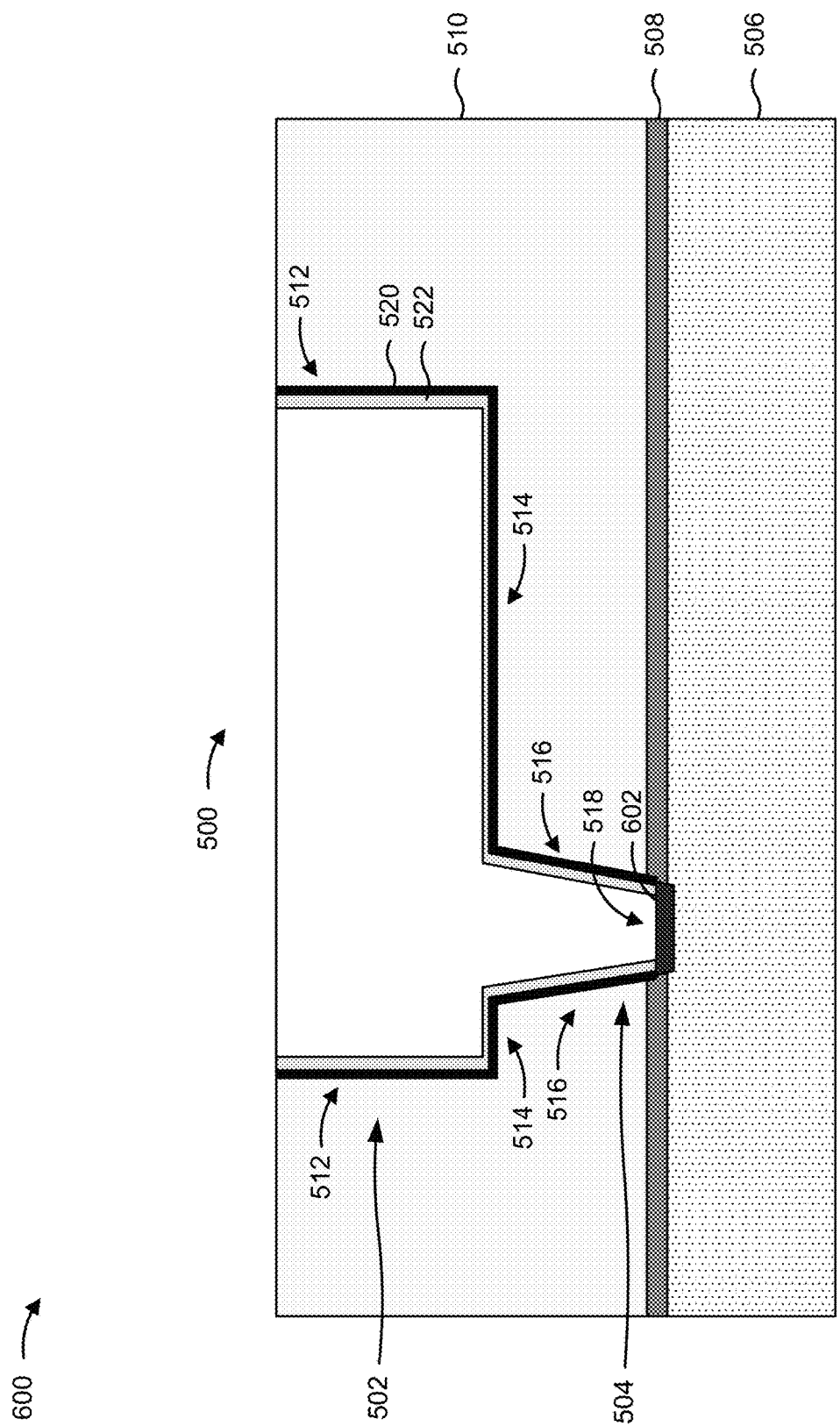

As shown in FIG. 6F, the ruthenium liner 522 may be formed on the ruthenium oxide film 520 over the sidewalls 512 and the bottom surface 514 of the trench 502, and on the ruthenium oxide film 520 over the sidewalls 516 of the via 504. The deposition tool 102 may deposit the ruthenium liner 522 by performing an ALD operation or a CVD operation. The deposition tool 102 may form the ruthenium liner 522 to a thickness in a range of approximately 5 angstroms to approximately 25 angstroms on the ruthenium oxide film 520 over the sidewalls 512 and the bottom surface 514 of the trench 502, and on the ruthenium oxide film 520 over the sidewalls 516 of the via 504.

As described above, the non-metallic passive layer 602 blocks or prevents ruthenium precursors from being absorbed in the lower metallization layer 506. Accordingly, the non-metallic passive layer 602 may block or prevent the ruthenium liner 522 from being deposited on the bottom surface 518 of the via 504. In some implementations, a residual amount of the ruthenium liner 522 (e.g., less than approximately 10 angstroms) is formed on the bottom surface 518.

Figure 6G:
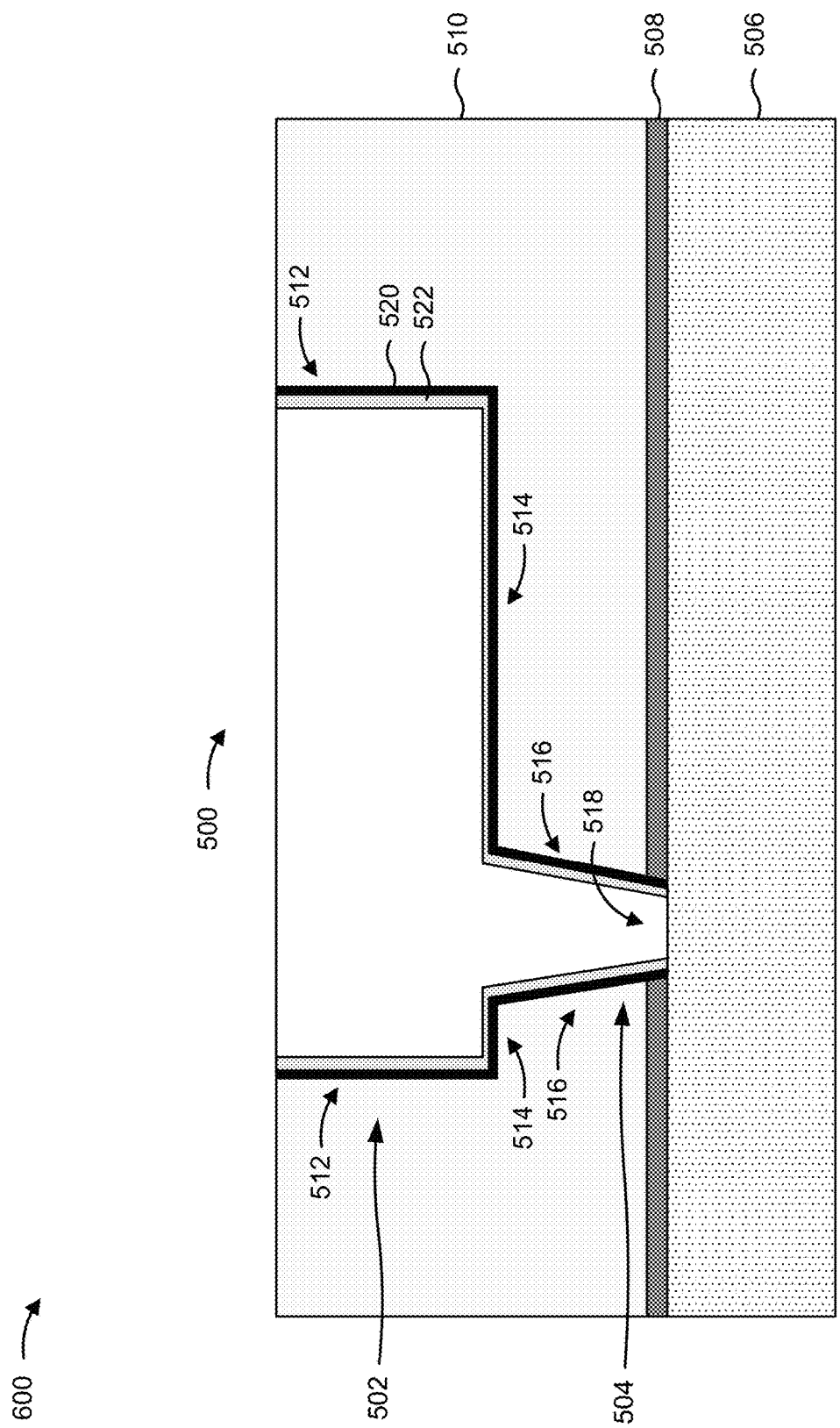

As shown in FIG. 6G, the passive layer 602 may be removed from the bottom surface 518 of the via 504 after formation of the ruthenium oxide film 520 and after formation of the ruthenium liner 522. The plasma tool 116 may perform a plasma treatment operation to remove the passive layer 602 from the bottom surface 518 using an ammonia-based plasma, an oxygen-based plasma, a hydrogen-based plasma, or a plasma including another type of ions. For example, the plasma tool 116 may bombard the passive layer 602 with ammonia ions, oxygen ions, or another type of ions to sputter etch the passive layer 602 off the bottom surface 518, which causes the bottom surface 518 to become metallic again. An anneal may be performed to vaporize the removed material of the passive layer 602, and the vaporized material may be vacuumed from a processing chamber of the plasma tool 116. Returning the metallic properties to the bottom surface 518 of the via 504 promotes metal-to-metal adhesion between the copper or cobalt of the bottom surface 518 and the copper layer 524 that is to be filled in the dual damascene structure 500, which minimizes or prevents the formation of voids, islands, and other defects in the copper layer 524.

Figure 6H:
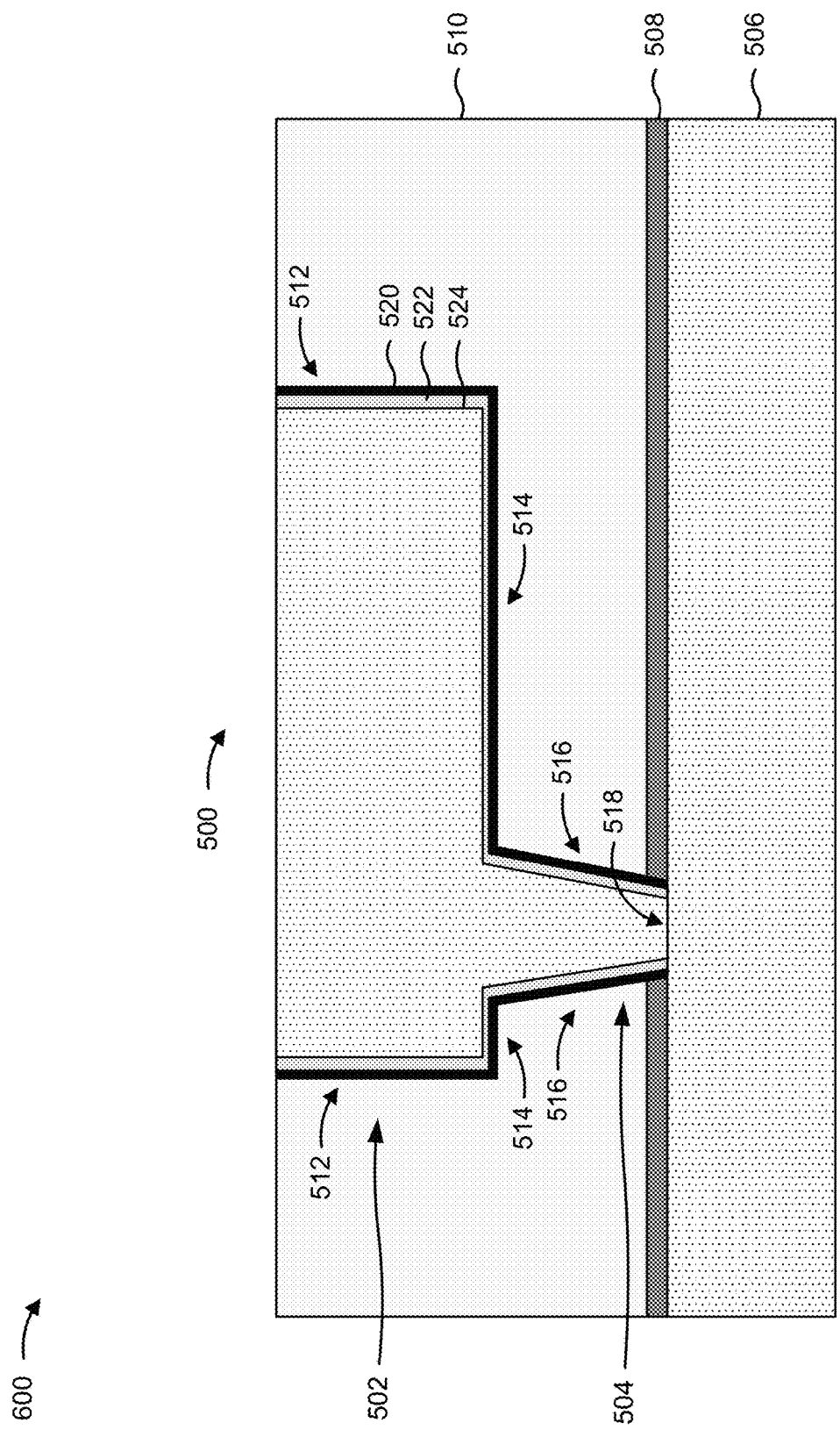

As shown in FIG. 6H, the copper layer 524 may be formed in the remaining volume of the dual damascene structure 500 (e.g., in the via 504 and the trench 502) such that the dual damascene structure 500 is filled with copper. The deposition tool 102 may perform a deposition operation and/or the plating tool 112 may perform a plating operation (e.g., an electroplating operation or an electroless plating operation) to cause copper to grow the copper layer 524 over the ruthenium liner 522 in the via 504 and in the trench 502. The reflow operation may include heating the copper layer 524 to permit the copper layer 524 to flow. This permits the copper layer 524 to fill any voids or eliminate any material islands that may have been formed during the plating operation. In some implementations, the dual damascene structure 500 is heated during the plating operation such that the reflow operation and the plating operation are performed simultaneously. In some implementations, multiple plating operations and/or multiple reflow operations may be performed to fill the dual damascene structure 500 with the copper layer 524. The planarization tool 110 may perform a CMP operation to planarize the copper layer 524 after the plating operation and after the reflow operation.

As indicated above, FIGS. 6A-6H are provided as an example. Other examples may differ from what is described with regard to FIGS. 6A-6H. In some implementations, the process techniques described in connection with FIGS. 6A-6H may be used to form a single damascene structure, such as a via in an M0 BEOL metallization layer (e.g., the metallization layer closest to the MEOL region 230) over a contact plug. In these implementations, the sidewalls 516 and the bottom surface 518 of the via 504 may be formed in the dielectric layer 510, the bottom surface 518 may be modified to become non-metallic as described above, the ruthenium oxide film 520 may be deposited on the sidewalls 516 of the via 504, the ruthenium liner 522 may be deposited on the ruthenium oxide film 520, the bottom surface 518 may be recovered to become metallic after formation of the ruthenium liner 522, and the via 504 may be filled with the copper layer 524 over the ruthenium liner 522. The modification of the bottom surface 518 results in a bottom-less ruthenium liner 522 on the contact plug, while providing no ruthenium liner selectivity on the dielectric layer 510.

Figure 7:
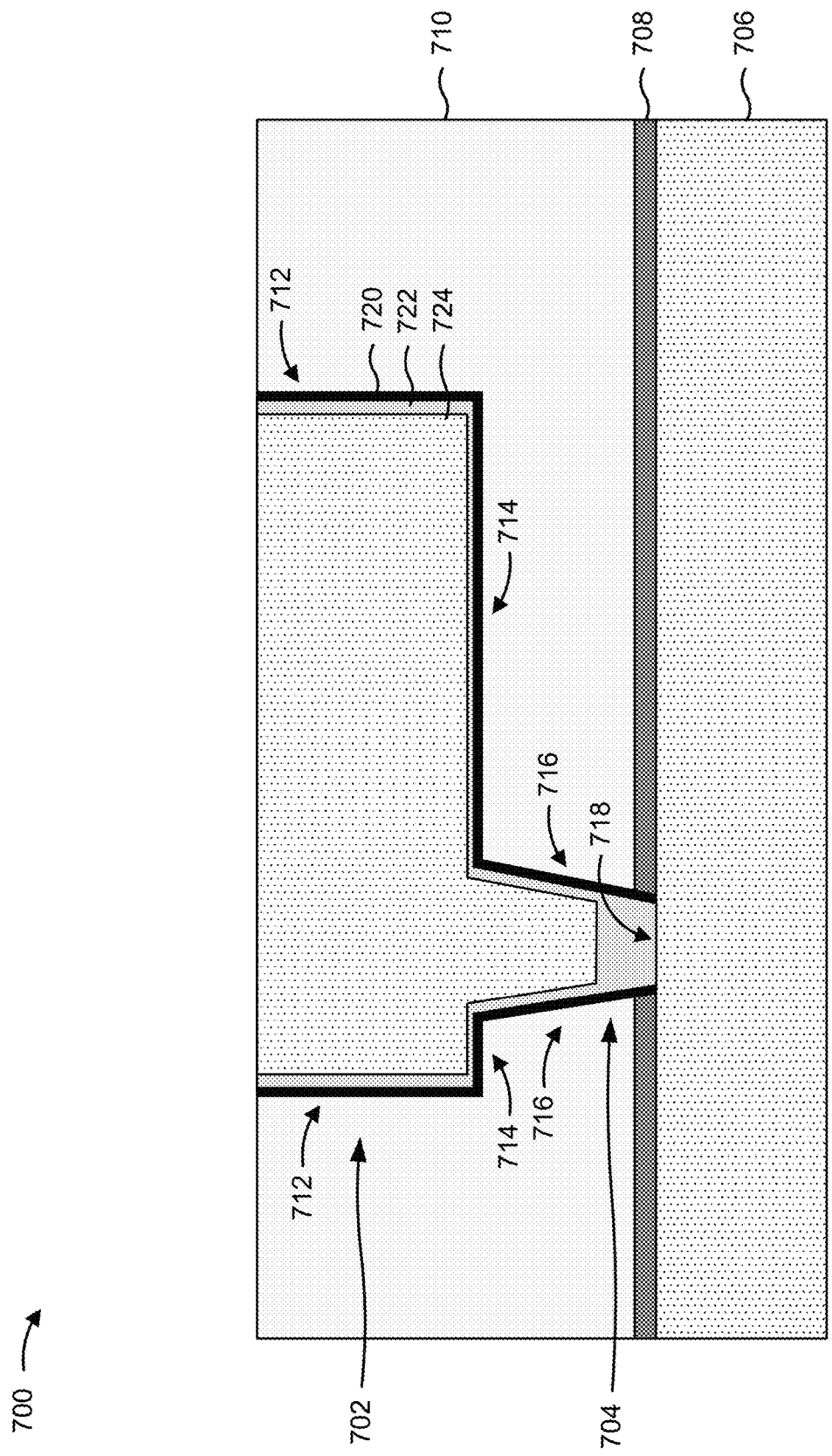
FIG. 7 is a diagram of an example dual damascene structure described herein.

FIG. 7 is a diagram of an example dual damascene structure 700 described herein. The dual damascene structure 700 may be an example of a dual damascene structure 248 that may be included in a device 200. The dual damascene structure 700 may include a trench 702 and a via 704. The via 704 may connect to a lower metallization layer 706, which may be formed of copper, cobalt, or another type of metallic material. The lower metallization layer 706 may include a trench of another dual damascene structure in the BEOL region 240 of the device 200, a via of a single damascene structure in the BEOL region 240, a contact plug in the MEOL region 230 of the device 200, or another type of interconnect. An etch stop layer 708 may be provided between the lower metallization layer 706 and a dielectric layer 710 above the lower metallization layer 706 to facilitate formation of the dual damascene structure 700.

The dual damascene structure 700 may be formed in the dielectric layer 710 and through the etch stop layer 708. The trench 702 may include sidewalls 712 and a bottom surface 714. The via 704 may also include sidewalls 716 and a bottom surface 718. The sidewalls 712, the bottom surface 714, and the sidewalls 716 may include portions of the dielectric layer 710 surrounding the dual damascene structure 700.

The bottom surface 718 of the via 704 may include a portion of the lower metallization layer 706 under the via 704. In some implementations, the via 704 is a circuit via. In these implementations, a width of the bottom surface 718 of the via 704 may be in a range of approximately 8 nm to approximately 12 nm for an M0 layer via or approximately 10 nm to approximately 22 nm for an M1-M3 layer via (e.g., the metallization layers above the M0 layer). In some implementations, the via 704 is a seal ring via. In these implementations, the width of the bottom surface 718 of the via 704 may be in a range of approximately 100 nm to approximately 180 nm.

A ruthenium oxide ($RuO_x$) film 720 may be included on the sidewalls 712, the bottom surface 714, and the sidewalls 716 of the dual damascene structure 700. The ruthenium oxide film 720 may promote adhesion between the surrounding dielectric layer 710 and a ruthenium liner 722 included over the sidewalls 712, the bottom surface 714, and the sidewalls 716 of the dual damascene structure 700 and on the ruthenium oxide film 720. In this way, the ruthenium oxide film 720 reduces and/or prevents the formation of discontinuities in the ruthenium liner 722 during deposition of the ruthenium liner 722. A thickness of the ruthenium oxide film 720 on the sidewalls 712, on the bottom surface 714, and on the sidewalls 716 may be in a range of approximately 5 angstroms (to minimize or prevent discontinuities in the ruthenium oxide film 720) to approximately 10 angstroms (to achieve a low sheet resistance for the dual damascene structure 700).

The ruthenium liner 722 may function as a diffusion barrier for a copper (Cu) layer 724 that is filled in the dual damascene structure 700 (e.g., in the trench 702 and in the via 704) over the ruthenium liner 722. In this way, the ruthenium liner 722 reduces or prevents copper atoms from diffusing into the dielectric layer 710 and the layers beneath the dielectric layer 710. Moreover, the ruthenium liner 722 may decrease the overall resistivity of the dual damascene structure 700, as the sheet resistance of thin film ruthenium is lower than other copper diffusion barrier layers such as tantalum nitride (TaN). A thickness of the ruthenium liner 722 on the sidewalls 712, on the bottom surface 714, and on the sidewalls 716 may be in a range of approximately 5 angstroms (to provide a sufficient copper diffusion barrier) to approximately 15 angstroms (to achieve a low sheet resistance for the dual damascene structure 700) in an M2 layer or an M3 layer in the BEOL region 240 of the device 200, and may be in a range of approximately 10 angstroms to approximately 35 angstroms in an M1 layer in the BEOL region 240.

The ruthenium liner 722 may further be included on the bottom surface 718 of the via 704, and may fill up a portion of the volume in the via 704. Depositing the copper layer 724 in the via 704 may result in voids, islands, and other discontinuities in the copper layer 724 due to the plating process that is used to deposit the copper layer 724 in the via 704. The ruthenium liner 722 may be formed in the via 704 in a super-conformal (e.g., bottom-up) deposition process, which may result in fewer voids and other discontinuities relative to the copper layer 724 deposition process and may achieve a lower aspect ratio. The thickness of the ruthenium liner 722 on the bottom surface 718 of the via 704 may be greater than the thickness of the ruthenium liner 722 on the sidewalls 712, on the bottom surface 714, and on the sidewalls 716 to minimize and/or prevent the formation of voids and other discontinuities, and to reduce the amount of the copper layer 724 that is to be formed in the via 704. The ruthenium liner 722 on the sidewalls 712, on the bottom surface 714, and on the sidewalls 716 may be formed relatively thinner than the ruthenium liner 722 on the bottom surface 718 of the via 704 because the ruthenium oxide film 720 promotes adhesion between the ruthenium liner 722 and the dielectric layer 710, which reduces the likelihood of discontinuity formation.

The thickness of the ruthenium liner 722 on the bottom surface 718 of the via 704 may be in a range of approximately 20 angstroms to approximately 60 angstroms for a circuit via to minimize the likelihood of formation of voids and other discontinuities in the ruthenium liner 722 and in the copper layer 724 (e.g., by reducing the amount of copper material that is needed to fill the via 704). In some implementations, the thickness of the ruthenium liner 722 on the bottom surface 718 of the via 704 for a seal ring via may be in a range of approximately 50% to approximately 80% of the thickness of the ruthenium liner 722 on the bottom surface 718 of a circuit via (e.g., in a range of approximately 16 angstroms to approximately 48 angstroms). In some implementations, the transition angle between the ruthenium liner 722 on the bottom surface 718 and the ruthenium liner 722 on the sidewalls 716 of the via 704 for a seal ring via may be in a range of approximately 30 degrees to approximately 60 degrees as a result of the super-conformal deposition process for the ruthenium liner 722.

In some implementations, the ruthenium oxide film 720 may be formed such that the ruthenium oxide film 720 is omitted from the bottom surface 718 of the via 704, as shown in the example in FIG. 7. In these implementations, the ruthenium liner 722 is included directly on the bottom surface 718 of the via 704, and the copper layer 724 partially fills the via 704 over the ruthenium liner 722. In some implementations, a residual amount of the ruthenium oxide film 720 forms over the bottom surface 718 of the via 704 during formation of the ruthenium oxide film 720. In implementations where a residual amount of the ruthenium oxide film 720 is included over the bottom surface 718, a thickness of the ruthenium oxide film 720 over the bottom surface 718 may be greater than 0 angstroms and less than approximately 5 angstroms to minimize the impact of the ruthenium oxide on the contact resistance of the dual damascene structure 700.

As indicated above, FIG. 7 is provided as an example. Other examples may differ from what is described with regard to FIG. 7.

Figure 8A:
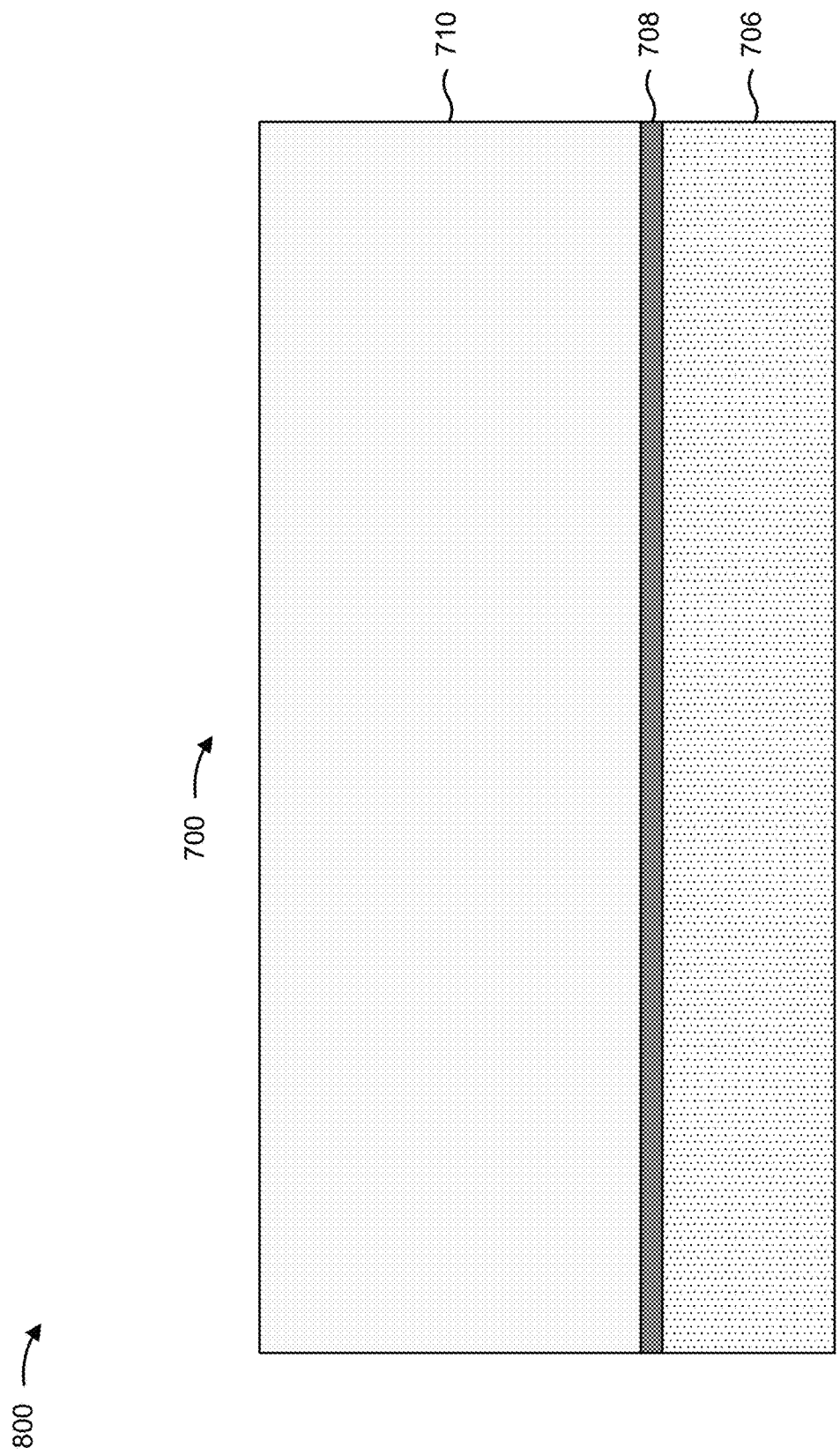
FIGS. 8A-8G are diagrams of an example implementation described herein.

FIGS. 8A-8G are diagrams of an example implementation 800 described herein. The example implementation 800 may be an example of forming the dual damascene structure 700 of FIG. 7. In some implementations, one or more of the semiconductor processing tools 102-116 perform one or more of the processes and/or operations described in connection with FIGS. 8A-8G. As shown in FIG. 8A, the dual damascene structure 700 may be formed in the dielectric layer 710 above the lower metallization layer 706. The etch stop layer 708 may be included between the dielectric layer 710 and the lower metallization layer 706 to facilitate the formation of the dual damascene structure 700 in the dielectric layer 710.

Figure 8B:
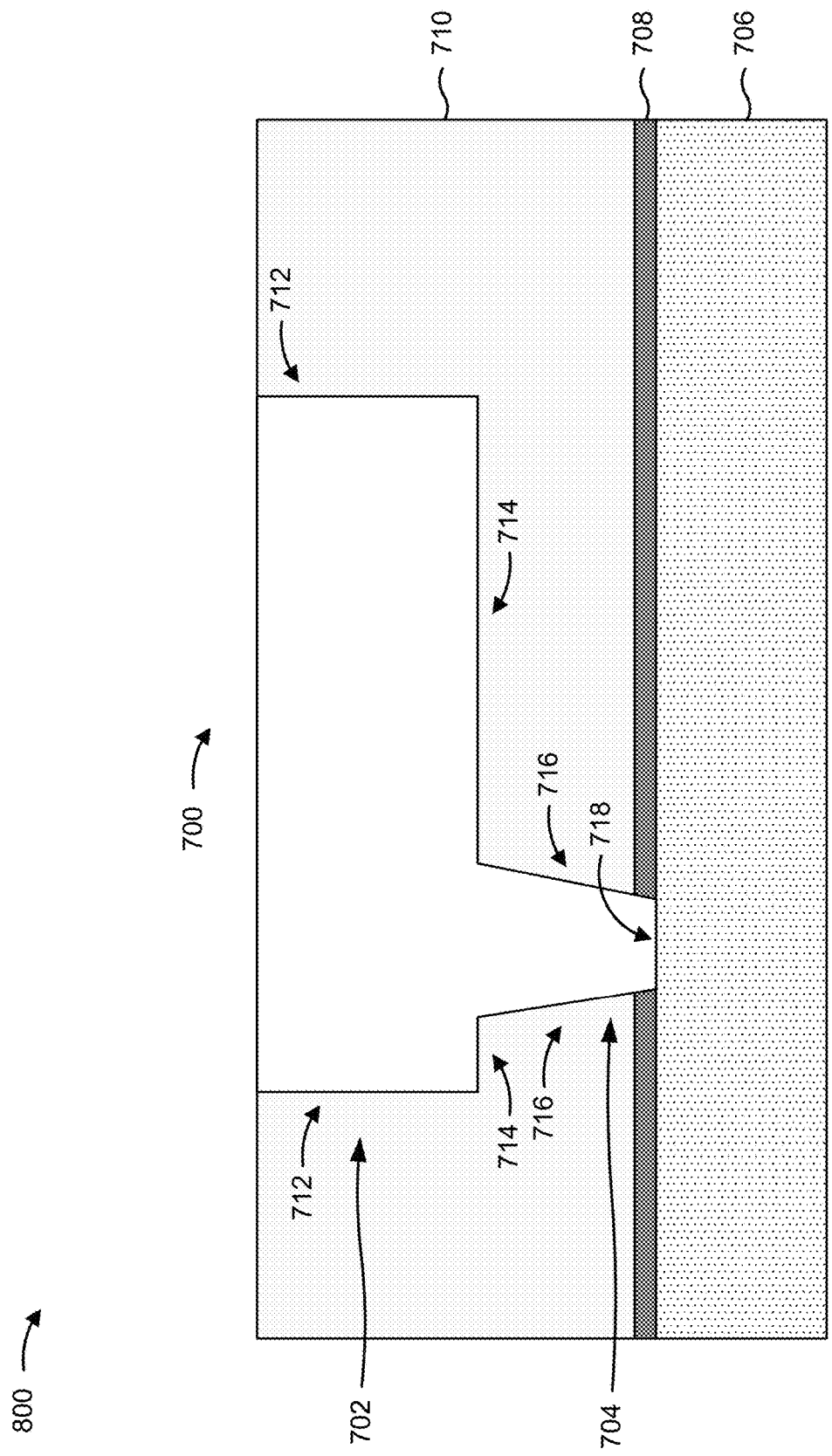

As shown in FIG. 8B, the trench 702 and the via 704 of the dual damascene structure 700 may be formed in the dielectric layer 710. One or more of the semiconductor processing tools 102-116 may form the trench 702 and the via 704 in the dielectric layer 710 by performing a via-first dual damascene process, a trench-first dual damascene process, or another dual damascene process, as described above.

Figure 8C:
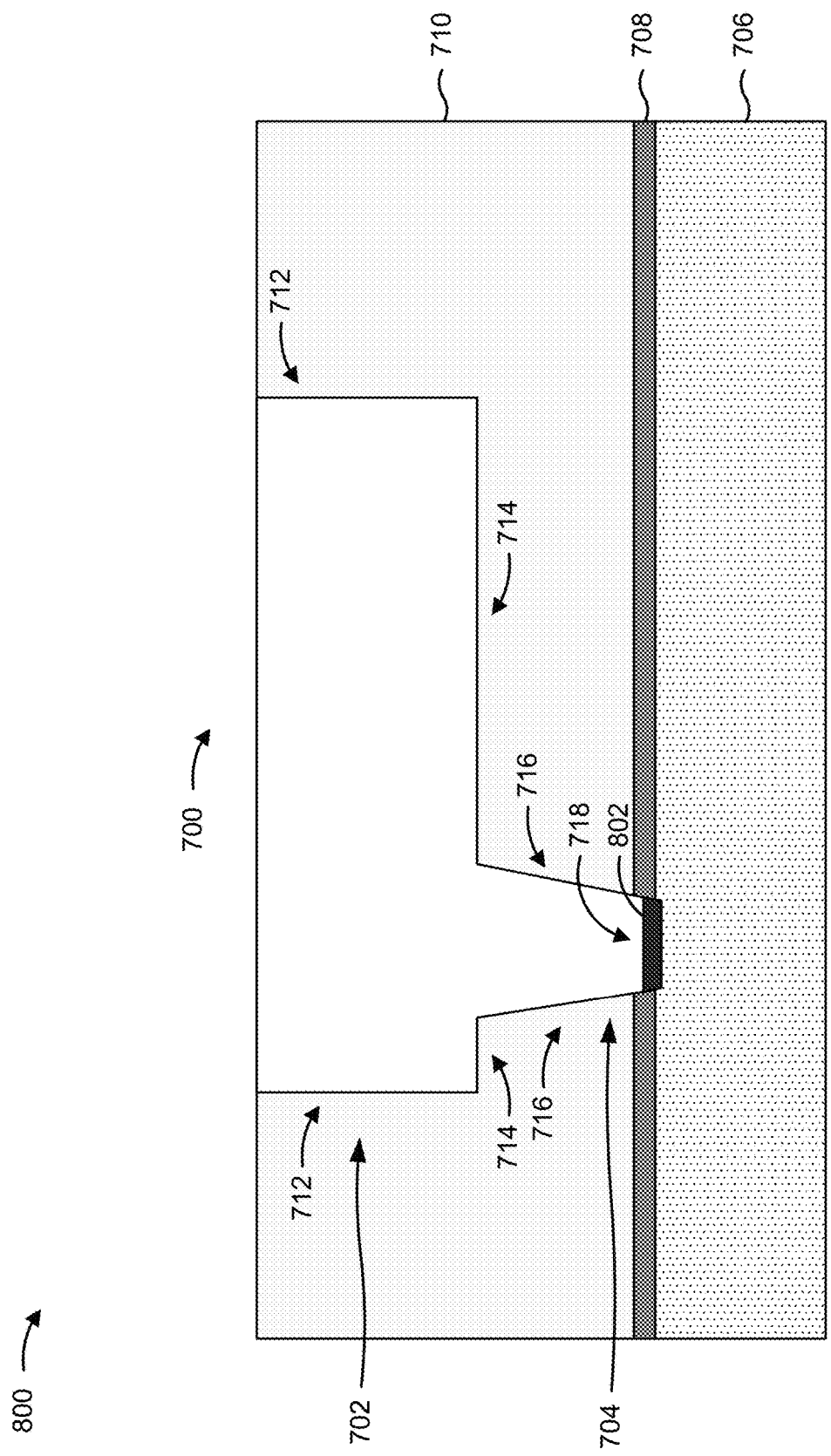

As shown in FIG. 8C, the bottom surface 718 of the via 704 may be modified to resist or prevent formation of the ruthenium liner 722 on the bottom surface 718. In particular, the pre-treatment tool 114 may perform a pre-treatment operation to cause the bottom surface 718 of the via 704 to become non-metallic. The pre-treatment operation may include immersing the bottom surface 718 of the via 704 in benzotriazole (BTA) for a time duration to cause a non-metallic passive layer 602 to form on the bottom surface 718. The bottom surface 718 may be soaked in the BTA, which causes a complex between the metal material (e.g., copper) of the lower metallization layer 706 and the BTA to form the passive layer 802. The copper-BTA complex in the passive layer 802 acts as a corrosion inhibitor, and prevents or blocks ruthenium precursors from being absorbed into the bottom surface 718 of the via 704 (e.g., the lower metallization layer 706).

Figure 8D:
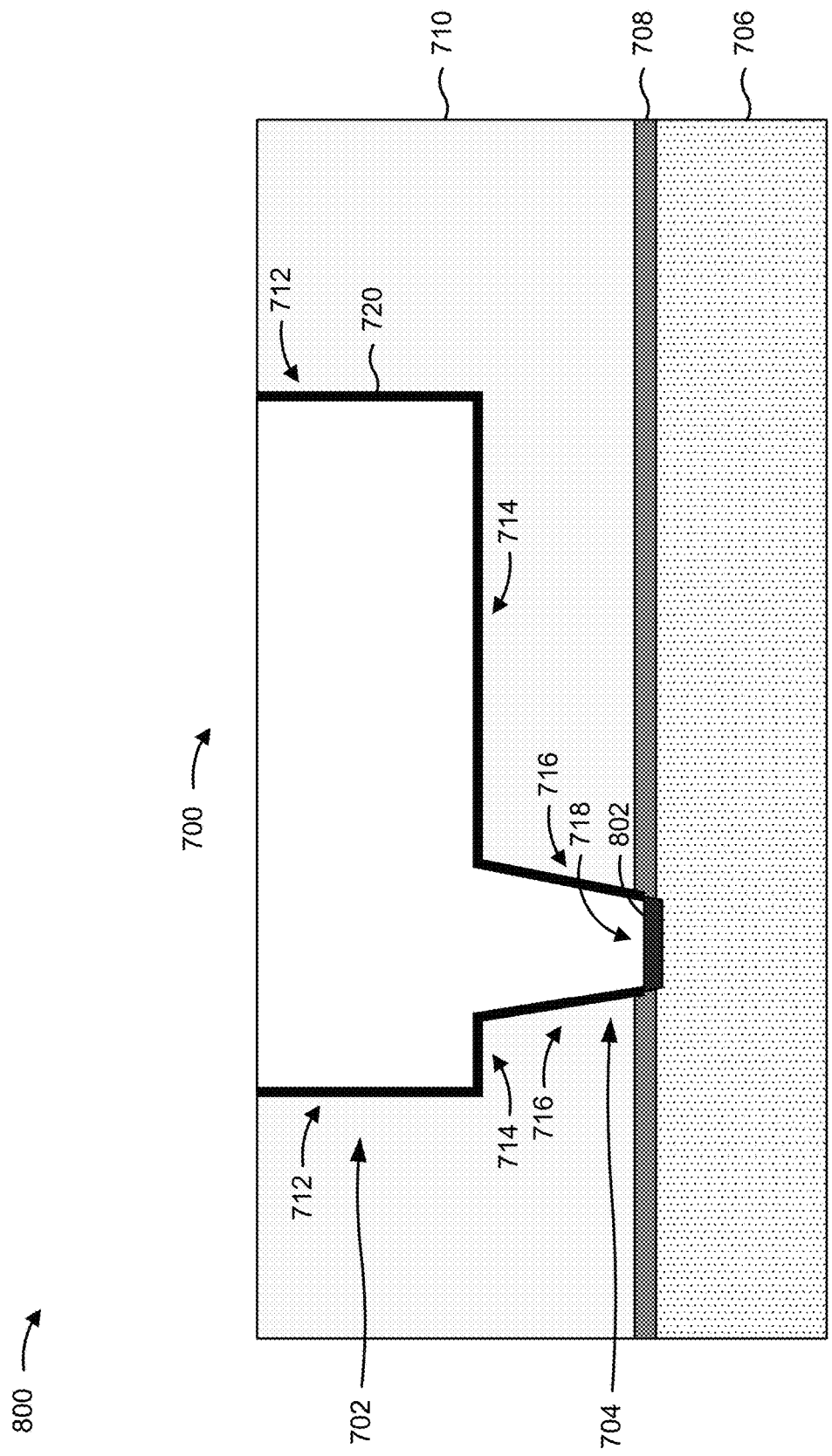

As shown in FIG. 8D, the ruthenium oxide film 720 may be formed on the sidewalls 712 and the bottom surface 714 of the trench 702, and on the sidewalls 716 of the via 704. The deposition tool 102 may deposit the ruthenium oxide film 720 directly onto the sidewalls 712, on the bottom surface 714, and on the sidewalls 716 by performing an ALD operation or a CVD operation. The deposition tool 102 may form the ruthenium oxide film 720 to a thickness in a range of approximately 5 angstroms to approximately 10 angstroms on the sidewalls 712, on the bottom surface 714, and on the sidewalls 716. The ruthenium oxide film 720 may be deposited on the sidewalls 712, on the bottom surface 714, and on the sidewalls 716 to precise control over the formation of the ruthenium oxide film 720 and to minimize variation in the thickness of the ruthenium oxide film 720.

As described above, the non-metallic passive layer 802 blocks or prevents ruthenium precursors from being absorbed in the lower metallization layer 706. Accordingly, the non-metallic passive layer 802 may block or prevent the ruthenium precursors in the ruthenium oxide film 720 from being absorbed into the bottom surface 718 of the via 704. In some implementations, a residual amount of the ruthenium oxide film 720 (e.g., less than approximately 5 angstroms) is formed over the bottom surface 718.

Figure 8E:
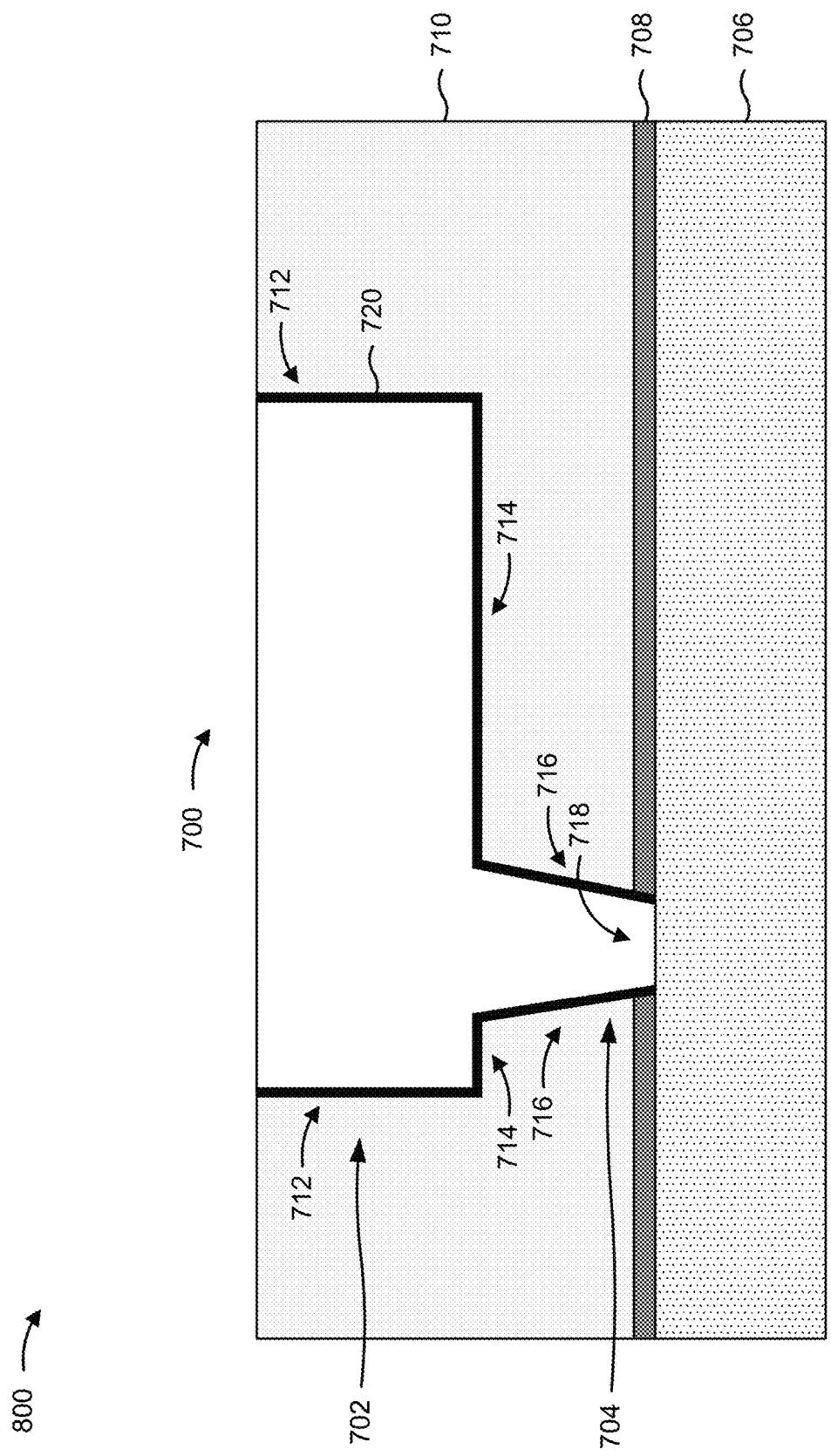

As shown in FIG. 8E, the passive layer 802 may be removed from the bottom surface 718 of the via 704 after formation of the ruthenium oxide film 720. The plasma tool 116 may perform a plasma treatment operation to remove the passive layer 802 from the bottom surface 718 using an ammonia-based plasma, an oxygen-based plasma, a hydrogen-based plasma, or a plasma including another type of ions. For example, the plasma tool 116 may bombard the passive layer 802 with ammonia ions, oxygen ions, or another type of ions to sputter etch the passive layer 802 off the bottom surface 718, which causes the bottom surface 718 to become metallic again. An anneal may be performed to vaporize the removed material of the passive layer 802, and the vaporized material may be vacuumed from a processing chamber of the plasma tool 116. Returning the metallic properties to the bottom surface 718 of the via 704 promotes metal-to-metal adhesion between the copper or cobalt of the bottom surface 718 and the ruthenium (which is a transition metal) in the ruthenium liner 722 that is to be formed on the bottom surface 718, which minimizes or prevents the formation of voids and other defects in the ruthenium liner 722.

Figure 8F:
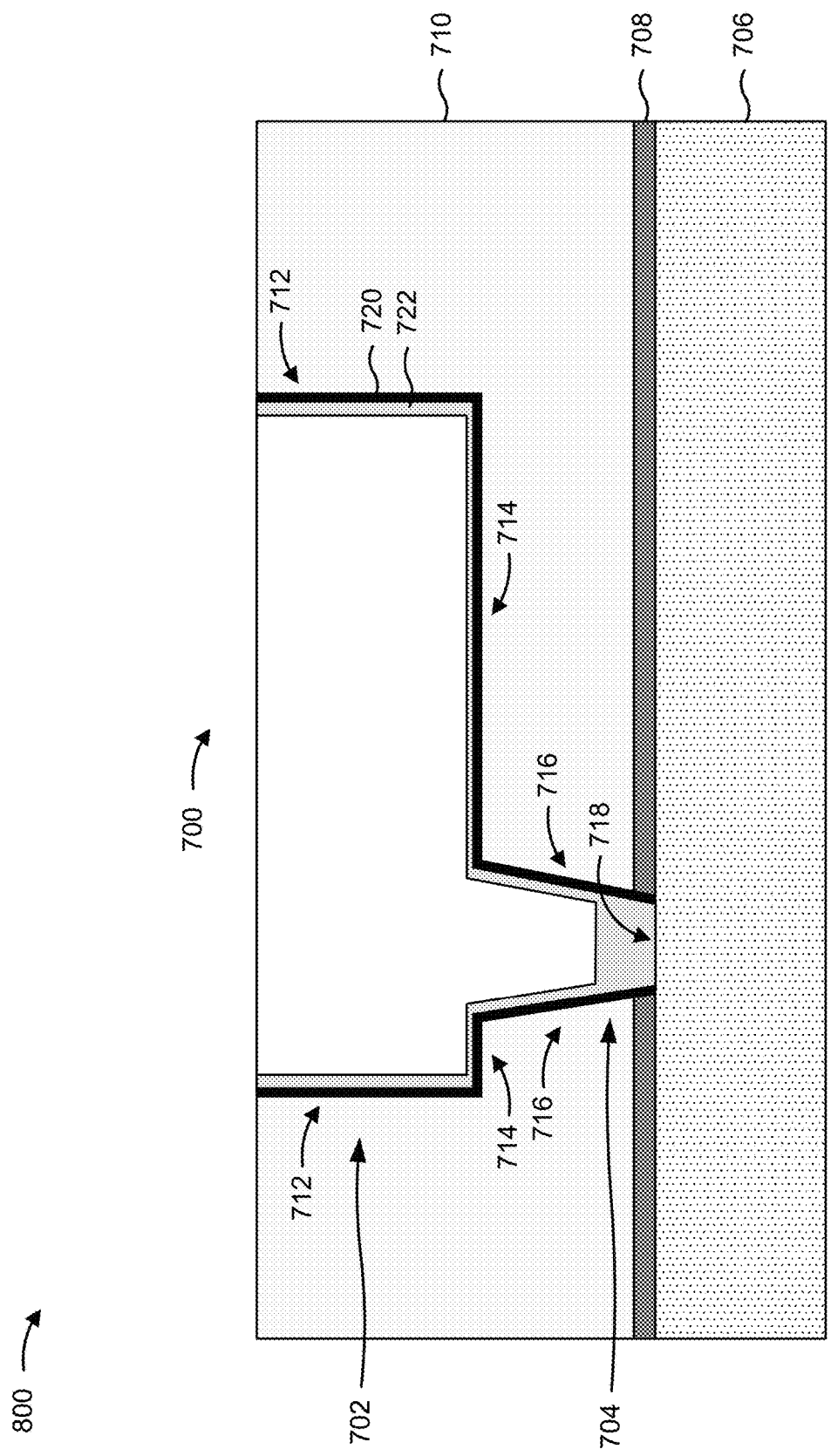

As shown in FIG. 8F, the ruthenium liner 722 may be formed after the plasma treatment operation on the bottom surface 718. The ruthenium liner 722 may be formed on the ruthenium oxide film 720 over the sidewalls 712 and the bottom surface 714 of the trench 702, and on the ruthenium oxide film 720 over the sidewalls 716 of the via 704. The ruthenium liner 722 may also be formed directly on the bottom surface 718 of the via 704. The deposition tool 102 may deposit the ruthenium liner 722 by performing an ALD operation or a CVD operation. The deposition tool 102 may form the ruthenium liner 722 to a thickness in a range of approximately 10 angstroms to approximately 35 angstroms on the ruthenium oxide film 720 over the sidewalls 712 and the bottom surface 714 of the trench 702, and on the ruthenium oxide film 720 over the sidewalls 716 of the via 704. The deposition tool 102 may form the ruthenium liner 722 on the bottom surface 718 of the via 704 to a thickness in a range of approximately 16 angstroms to approximately 60 angstroms.

Figure 8G:
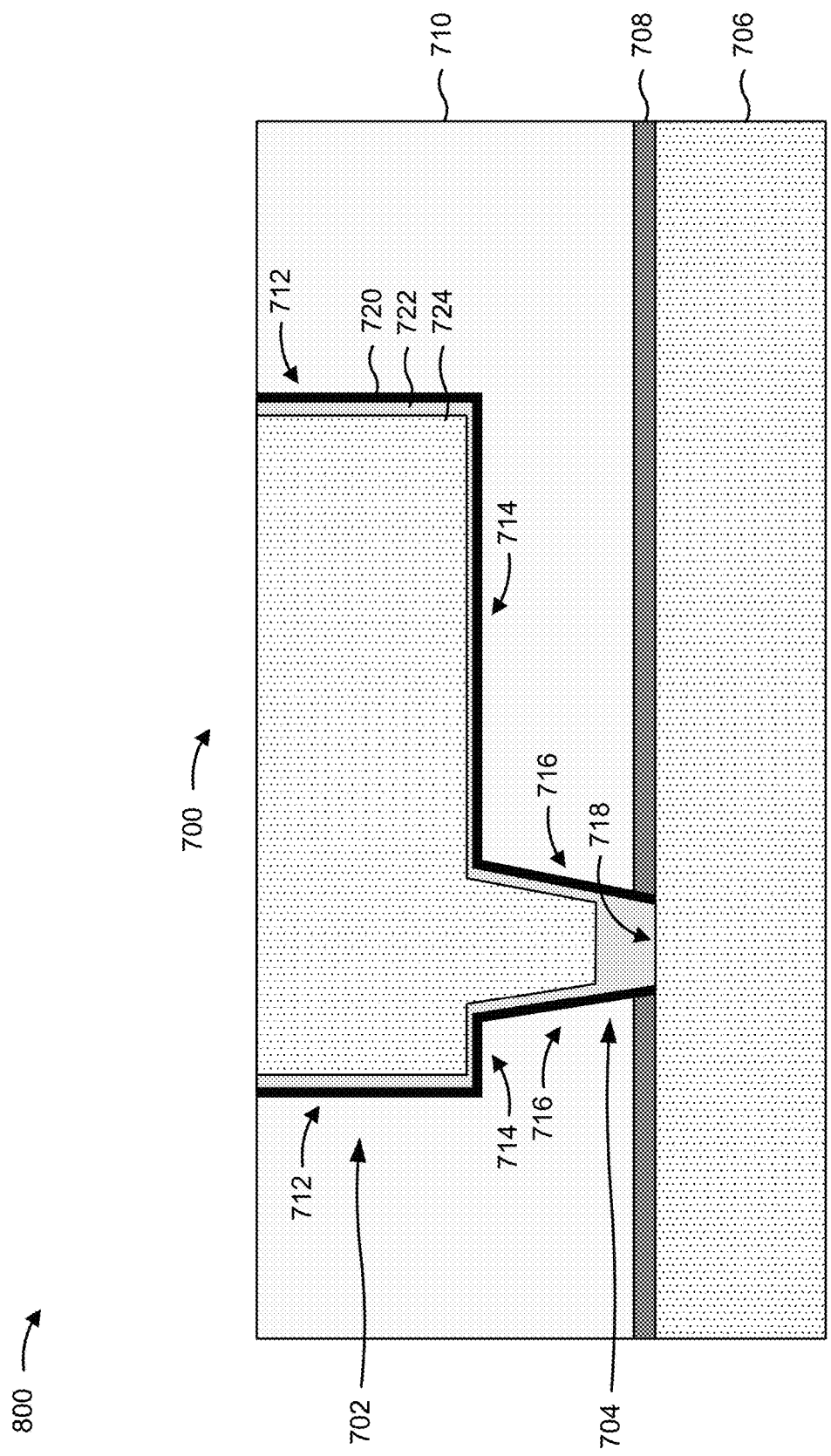

As shown in FIG. 8G, the copper layer 724 may be formed in the remaining volume of the dual damascene structure 700 (e.g., in the via 704 and the trench 702) over the ruthenium liner 722 such that the dual damascene structure 700 is filled with copper. The deposition tool 102 may perform a deposition operation and/or the plating tool 112 may perform a plating operation (e.g., an electroplating operation or an electroless plating operation) to cause copper to grow the copper layer 724 over the ruthenium liner 722 in the via 704 and in the trench 702. The reflow operation may include heating the copper layer 724 to permit the copper layer 724 to flow. This permits the copper layer 724 to fill any voids or eliminate any material islands that may have been formed during the plating operation. In some implementations, the dual damascene structure 700 is heated during the plating operation such that the reflow operation and the plating operation are performed simultaneously. In some implementations, multiple plating operations and/or multiple reflow operations may be performed to fill the dual damascene structure 700 with the copper layer 724. The planarization tool 110 may perform a CMP operation to planarize the copper layer 724 after the plating operation and after the reflow operation.

As indicated above, FIGS. 8A-8G are provided as an example. Other examples may differ from what is described with regard to FIGS. 8A-8G. In some implementations, the process techniques described in connection with FIGS. 8A-8G may be used to form a single damascene structure, such as in an M0 BEOL metallization layer (e.g., the metallization layer closest to the MEOL region 230). In these implementations, the sidewalls 716 and the bottom surface 718 of the via 704 may be formed in the dielectric layer 710, the bottom surface 718 may be modified to become non-metallic as described above, the ruthenium oxide film 720 may be deposited on the sidewalls 716 of the via 704, the bottom surface 718 may be recovered to become metallic after formation of the ruthenium oxide film 720, the ruthenium liner 722 may be deposited on the bottom surface 718 and over the ruthenium oxide film 720 on the sidewalls 716, and the remaining volume of the via 704 may be filled with the copper layer 724 over the ruthenium liner 722.

Figure 9:
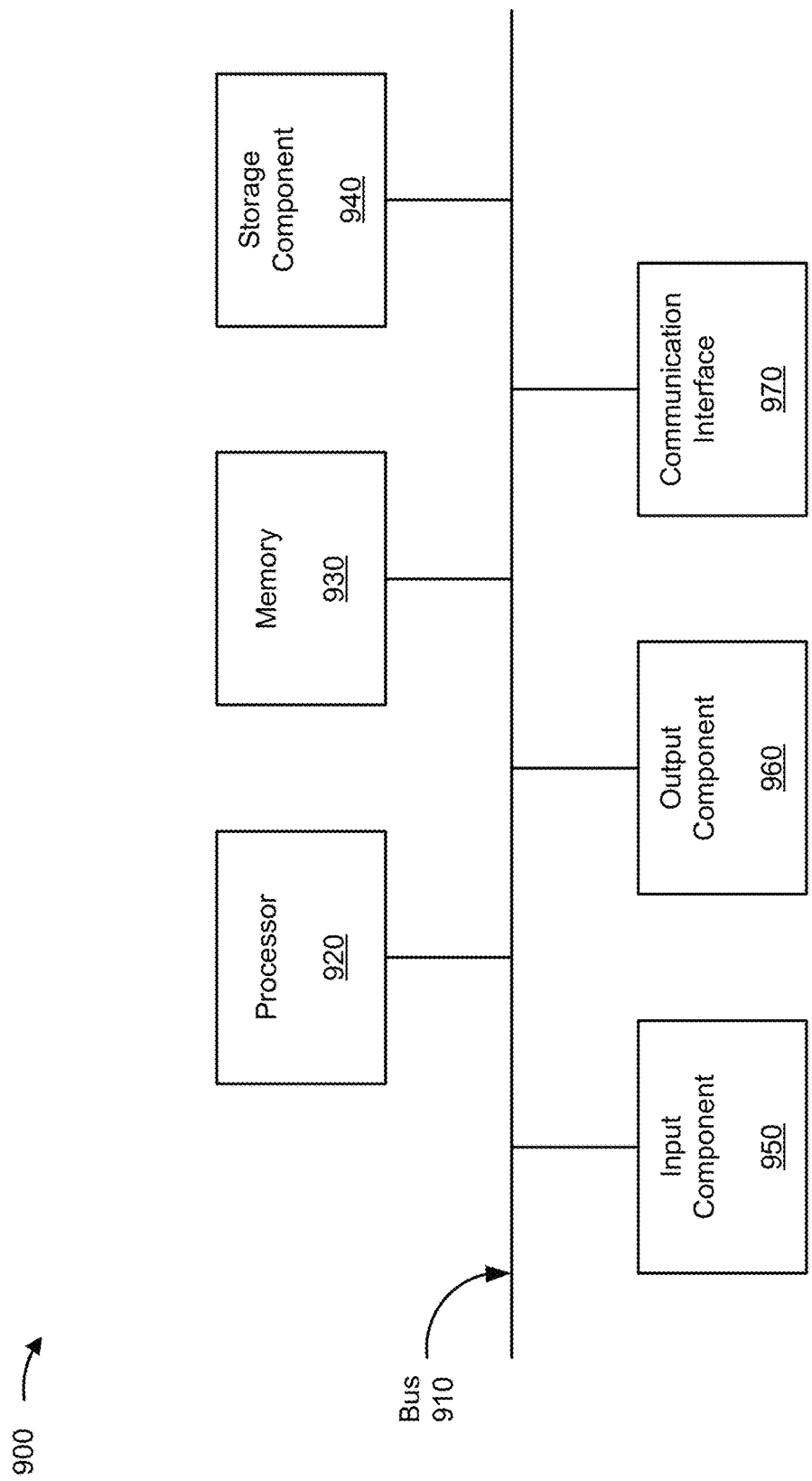
FIG. 9 is a diagram of example components of one or more devices of FIG. 1.

FIG. 9 is a diagram of example components of a device 900. In some implementations, one or more of the semiconductor processing tools 102-116 and/or the wafer/die transport tool 118 may include one or more devices 900 and/or one or more components of device 900. As shown in FIG. 9, device 900 may include a bus 910, a processor 920, a memory 930, a storage component 940, an input component 950, an output component 960, and a communication component 970.

Bus 910 includes a component that enables wired and/or wireless communication among the components of device 900. Processor 920 includes a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 includes one or more processors capable of being programmed to perform a function. Memory 930 includes a random access memory, a read only memory, and/or another type of memory (e.g., a flash memory, a magnetic memory, and/or an optical memory).

Storage component 940 stores information and/or software related to the operation of device 900. For example, storage component 940 may include a hard disk drive, a magnetic disk drive, an optical disk drive, a solid state disk drive, a compact disc, a digital versatile disc, and/or another type of non-transitory computer-readable medium. Input component 950 enables device 900 to receive input, such as user input and/or sensed inputs. For example, input component 950 may include a touch screen, a keyboard, a keypad, a mouse, a button, a microphone, a switch, a sensor, a global positioning system component, an accelerometer, a gyroscope, and/or an actuator. Output component 960 enables device 900 to provide output, such as via a display, a speaker, and/or one or more light-emitting diodes. Communication component 970 enables device 900 to communicate with other devices, such as via a wired connection and/or a wireless connection. For example, communication component 970 may include a receiver, a transmitter, a transceiver, a modem, a network interface card, and/or an antenna.

Device 900 may perform one or more processes described herein. For example, a non-transitory computer-readable medium (e.g., memory 930 and/or storage component 940) may store a set of instructions (e.g., one or more instructions, code, software code, and/or program code) for execution by processor 920. Processor 920 may execute the set of instructions to perform one or more processes described herein. In some implementations, execution of the set of instructions, by one or more processors 920, causes the one or more processors 920 and/or the device 900 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

Figure 10:
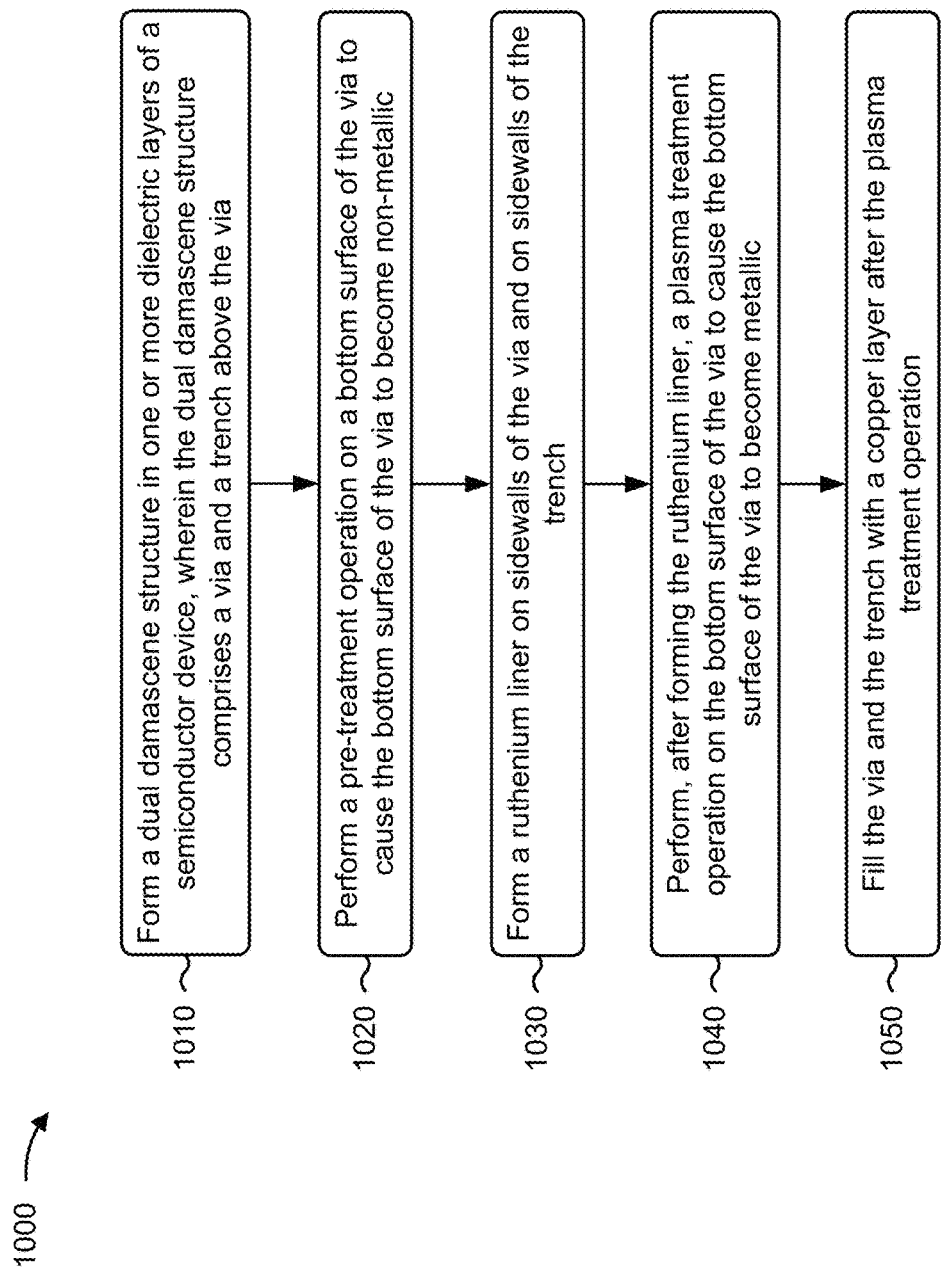
FIGS. 10 and 11 are flowcharts of example processes relating to forming a dual damascene structure.

FIG. 10 is a flowchart of an example process 1000 associated with ruthenium liner for copper interconnects in a device. In some implementations, one or more process blocks of FIG. 10 may be performed by one or more semiconductor processing tools (e.g., one or more of the semiconductor processing tools 102-116). Additionally, or alternatively, one or more process blocks of FIG. 10 may be performed by one or more components of device 900, such as processor 920, memory 930, storage component 940, input component 950, output component 960, and/or communication component 970.

As shown in FIG. 10, process 1000 may include forming a dual damascene structure in one or more dielectric layers of a device, where the dual damascene structure includes a via and a trench above the via (block 1010). For example, the one or more semiconductor processing tools may form a dual damascene structure (e.g., dual damascene structure 248, 300, 500, and/or 700) in one or more dielectric layers (e.g., dielectric layers 242, 244, 310, 510, and/or 710) of a device (e.g., device 200), as described above. In some implementations, the dual damascene structure includes a via (e.g., via 304, 504, and/or 704) and a trench (e.g., trench 302, 502, and/or 702) above the via.

As further shown in FIG. 10, process 1000 may include performing a pre-treatment operation on a bottom surface of the via to cause the bottom surface of the via to become non-metallic (block 1020). For example, the one or more semiconductor processing tools may perform a pre-treatment operation on a bottom surface (e.g., bottom surface 318, 518, and/or 718) of the via to cause the bottom surface of the via to become non-metallic, as described above.

As further shown in FIG. 10, process 1000 may include forming a ruthenium liner on sidewalls of the via and on sidewalls of the trench (block 1030). For example, the one or more semiconductor processing tools may form a ruthenium liner (e.g., ruthenium liner 322, 522, and/or 722) on sidewalls (e.g., sidewalls 316, 516, and/or 716) of the via and on sidewalls (e.g., sidewalls 312, 512, and/or 712) of the trench, as described above.

As further shown in FIG. 10, process 1000 may include performing, after forming the ruthenium liner, a plasma treatment operation on the bottom surface of the via to cause the bottom surface of the via to become metallic (block 1040). For example, the one or more semiconductor processing tools may perform, after forming the ruthenium liner, a plasma treatment operation on the bottom surface of the via to cause the bottom surface of the via to become metallic, as described above.

As further shown in FIG. 10, process 1000 may include filling the via and the trench with a copper layer after the plasma treatment operation (block 1050). For example, the one or more semiconductor processing tools may fill the via and the trench with a copper layer (e.g., the copper layer 324, 524, and/or 724) after the plasma treatment operation, as described above.

Process 1000 may include additional implementations, such as any single implementation or any combination of implementations described below and/or in connection with one or more other processes described elsewhere herein.

In a first implementation, performing the pre-treatment operation comprises immersing the bottom surface of the via in benzotriazole (BTA) to cause formation of a non-metallic passive layer on the bottom surface of the via. In a second implementation, alone or in combination with the first implementation, the bottom surface of the via being non-metallic blocks ruthenium precursors of the ruthenium liner from being absorbed into the bottom surface of the via, and the bottom surface of the via being metallic promotes adhesion between the copper layer and the bottom surface of the via.

In a third implementation, alone or in combination with one or more of the first and second implementations, performing the plasma treatment operation includes performing the plasma treatment operation using an ammonia-based plasma, an oxygen-based plasma, or a hydrogen-based plasma, and the plasma treatment operation causes plasma to penetrate the ruthenium liner and to remove surface carbon from the one or more dielectric layers. In a fourth implementation, alone or in combination with one or more of the first through third implementations, removal of surface carbon from the one or more dielectric layers results in an oxygen-rich surface of the one or more dielectric layers, and wherein the oxygen-rich surface promotes formation of a ruthenium oxide layer between the one or more dielectric layers and the ruthenium liner.

In a fifth implementation, alone or in combination with one or more of the first through fourth implementations, process 1000 includes depositing a ruthenium oxide film (e.g., ruthenium oxide film 520 and/or 720) on the sidewalls of the via and on the sidewalls of the trench, where forming the ruthenium liner on the sidewalls of the via and on the sidewalls of the trench includes forming the ruthenium liner over the ruthenium oxide film on the sidewalls of the via and over the ruthenium oxide film on the sidewalls of the trench. In a sixth implementation, alone or in combination with one or more of the first through fifth implementations, a thickness of the ruthenium oxide film is in a range of approximately 5 angstroms to approximately 10 angstroms, and wherein a thickness of the ruthenium liner is in a range of approximately 5 angstroms to approximately 25 angstroms. In a seventh implementation, alone or in combination with one or more of the first through sixth implementations, a thickness of the ruthenium liner on the bottom surface of the via is equal to or less than approximately 8 angstroms.

Although FIG. 10 shows example blocks of process 1000, in some implementations, process 1000 may include additional blocks, fewer blocks, different blocks, or differently arranged blocks than those depicted in FIG. 10. Additionally, or alternatively, two or more of the blocks of process 1000 may be performed in parallel.

Figure 11:
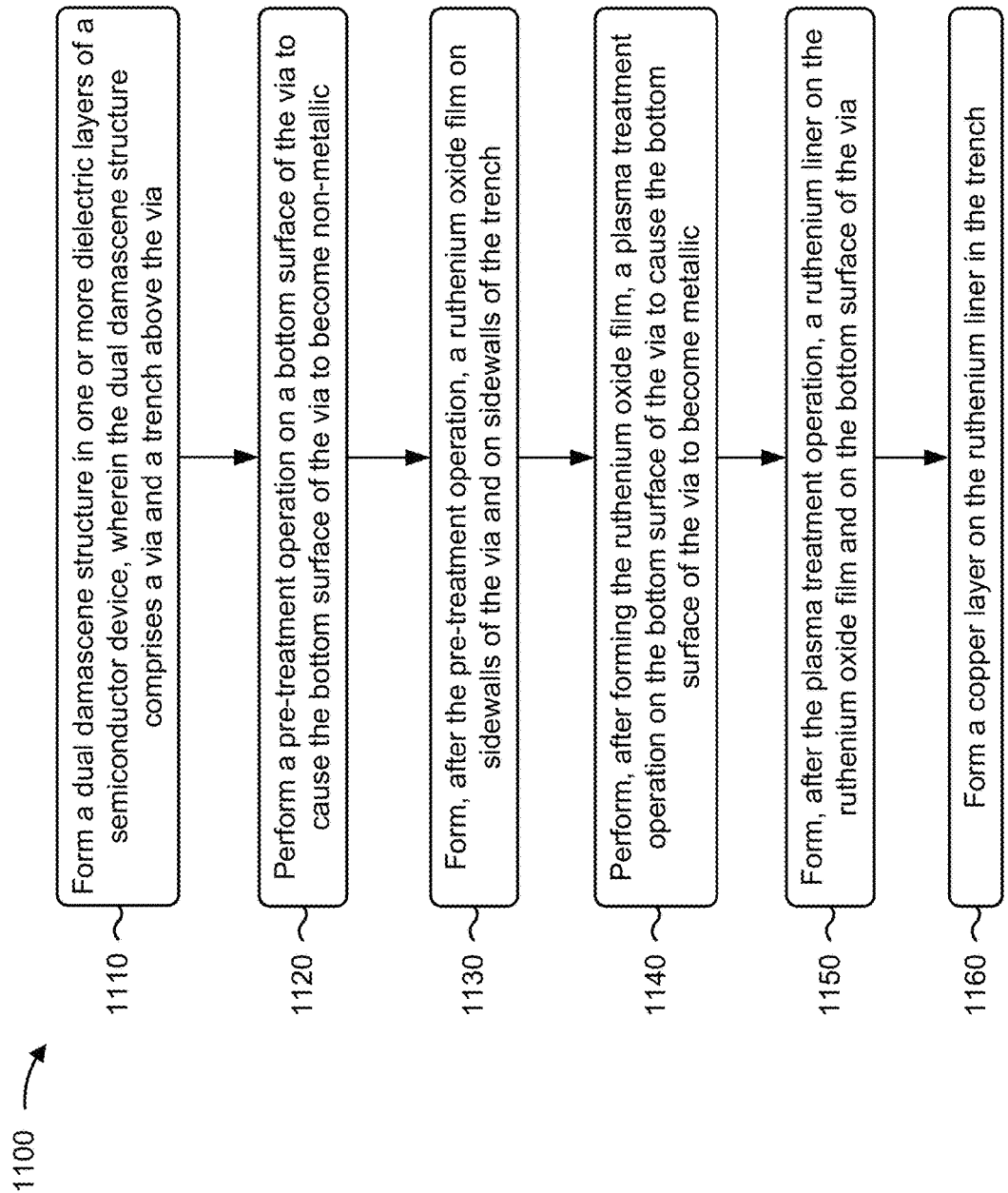

FIG. 11 is a flowchart of an example process 1100 associated with ruthenium liner for copper interconnects in a device. In some implementations, one or more process blocks of FIG. 11 may be performed by one or more semiconductor processing tools (e.g., one or more of the semiconductor processing tools 102-116). Additionally, or alternatively, one or more process blocks of FIG. 11 may be performed by one or more components of device 900, such as processor 920, memory 930, storage component 940, input component 950, output component 960, and/or communication component 970.

As shown in FIG. 11, process 1100 may include forming a dual damascene structure in one or more dielectric layers of a device, where the dual damascene structure includes a via and a trench above the via (block 1110). For example, the one or more semiconductor processing tools may form a dual damascene structure (e.g., dual damascene structure 248 and/or 700) in one or more dielectric layers (e.g., dielectric layer 242, 244, and/or 710) of a device (200), as described above. In some implementations, the dual damascene structure includes a via (e.g., via 704) and a trench (e.g., trench 702) above the via.

As further shown in FIG. 11, process 1100 may include performing a pre-treatment operation on a bottom surface of the via to cause the bottom surface of the via to become non-metallic (block 1120). For example, the one or more semiconductor processing tools may perform a pre-treatment operation on a bottom surface (e.g., bottom surface 718) of the via to cause the bottom surface of the via to become non-metallic, as described above.

As further shown in FIG. 11, process 1100 may include forming, after the pre-treatment operation, a ruthenium oxide film on sidewalls of the via and on sidewalls of the trench (block 1130). For example, the one or more semiconductor processing tools may form, after the pre-treatment operation, a ruthenium oxide film (e.g., ruthenium oxide film 720) on sidewalls (e.g., sidewalls 716) of the via and on sidewalls (e.g., sidewalls 712) of the trench, as described above.

As further shown in FIG. 11, process 1100 may include performing, after forming the ruthenium oxide film, a plasma treatment operation on the bottom surface of the via to cause the bottom surface of the via to become metallic (block 1140). For example, the one or more semiconductor processing tools may perform, after forming the ruthenium oxide film, a plasma treatment operation on the bottom surface of the via to cause the bottom surface of the via to become metallic, as described above.

As further shown in FIG. 11, process 1100 may include forming, after the plasma treatment operation, a ruthenium liner on the ruthenium oxide film and on the bottom surface of the via (block 1150). For example, the one or more semiconductor processing tools may form, after the plasma treatment operation, a ruthenium liner (e.g., ruthenium liner 722) on the ruthenium oxide film and on the bottom surface of the via, as described above.

As further shown in FIG. 11, process 1100 may include forming a copper layer on the ruthenium liner in the trench (block 1160). For example, the one or more semiconductor processing tools may form a copper layer (e.g., copper layer 724) on the ruthenium liner in the trench, as described above.

Process 1100 may include additional implementations, such as any single implementation or any combination of implementations described below and/or in connection with one or more other processes described elsewhere herein.

In a first implementation, the bottom surface of the via being metallic promotes adhesion between the ruthenium liner and the bottom surface of the via. In a second implementation, alone or in combination with the first implementation, the bottom surface of the via being non-metallic blocks ruthenium precursors of the ruthenium oxide film from being absorbed into the bottom surface of the via. In a third implementation, alone or in combination with one or more of the first and second implementations, process 1100 includes forming the copper layer partially in the via. In a fourth implementation, alone or in combination with one or more of the first through third implementations, forming the ruthenium liner includes forming the ruthenium liner on the bottom surface of the via to a thickness that is approximately equal to or greater than a thickness of the ruthenium liner on the ruthenium oxide film.

Although FIG. 11 shows example blocks of process 1100, in some implementations, process 1100 may include additional blocks, fewer blocks, different blocks, or differently arranged blocks than those depicted in FIG. 11. Additionally, or alternatively, two or more of the blocks of process 1100 may be performed in parallel.

In this way, ruthenium and ruthenium oxide may be used in single damascene processes and/or dual damascene processes to form BEOL metallization layers and vias of an electronic device. A ruthenium liner may be formed to achieve a low contact resistance and a low sheet resistance for the BEOL metallization layers and vias, to promote adhesion between the various layers and materials in the BEOL metallization layers and vias, and/or to reduce or eliminate defects (such as voids and discontinuities) in the BEOL metallization layers and vias. This may increase the electrical performance of the electronic device and may increase manufacturing yield.

As described in greater detail above, some implementations described herein provide a device. The device includes a dual damascene structure, included in one or more dielectric layers, including a via and a trench. The device includes a ruthenium oxide film directly on sidewalls of the via and directly on sidewalls of the trench. The device includes a ruthenium liner over the ruthenium oxide film on the sidewalls of the via and over the ruthenium oxide film on the sidewalls of the trench. The device includes a copper layer over the ruthenium liner in the via and in the trench.

As described in greater detail above, some implementations described herein provide a method. The method includes forming a dual damascene structure in one or more dielectric layers of a device, where the dual damascene structure comprises a via and a trench above the via. The method includes performing a pre-treatment operation on a bottom surface of the via to cause the bottom surface of the via to become non-metallic. The method includes forming a ruthenium liner on sidewalls of the via and on sidewalls of the trench. The method includes performing, after forming the ruthenium liner, a plasma treatment operation on the bottom surface of the via to cause the bottom surface of the via to become metallic. The method includes filling the via and the trench with a copper layer after the plasma treatment operation.

As described in greater detail above, some implementations described herein provide a method. The method includes forming a dual damascene structure in one or more dielectric layers of an electronic device, where the dual damascene structure comprises a via and a trench above the via. The method includes performing a pre-treatment operation on a bottom surface of the via to cause the bottom surface of the via to become non-metallic. The method includes forming, after the pre-treatment operation, a ruthenium oxide film on sidewalls of the via and on sidewalls of the trench. The method includes performing, after forming the ruthenium oxide film, a plasma treatment operation on the bottom surface of the via to cause the bottom surface of the via to become metallic. The method includes forming, after the plasma treatment operation, a ruthenium liner on the ruthenium oxide film and on the bottom surface of the via. The method includes forming a copper layer on the ruthenium liner in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a dual damascene structure in one or more dielectric layers of a device,
     wherein the dual damascene structure comprises a via and a trench above the via;
   performing a pre-treatment operation on a bottom surface of the via to cause the bottom surface of the via to become non-metallic;
   forming a ruthenium liner on sidewalls of the via and on sidewalls of the trench;
   performing, after forming the ruthenium liner, a plasma treatment operation on the bottom surface of the via to cause the bottom surface of the via to become metallic; and
   filling the via and the trench with a copper layer after the plasma treatment operation.

2. The method of claim 1, wherein performing the pre-treatment operation comprises:
   immersing the bottom surface of the via in benzotriazole (BTA) to cause formation of a non-metallic passive layer on the bottom surface of the via.

3. The method of claim 1, wherein the bottom surface of the via being non-metallic blocks ruthenium precursors of the ruthenium liner from being absorbed into the bottom surface of the via; and
   wherein the bottom surface of the via being metallic promotes adhesion between the copper layer and the bottom surface of the via.

4. The method of claim 1, wherein performing the plasma treatment operation comprises:
   performing the plasma treatment operation using an ammonia-based plasma, an oxygen-based plasma, or a hydrogen-based plasma; and
   wherein the plasma treatment operation causes plasma to penetrate the ruthenium liner and to remove surface carbon from the one or more dielectric layers.

5. The method of claim 4, wherein removal of surface carbon from the one or more dielectric layers results in an oxygen-rich surface of the one or more dielectric layers; and
   wherein the oxygen-rich surface promotes formation of a ruthenium oxide layer between the one or more dielectric layers and the ruthenium liner.

6. The method of claim 1, further comprising:
   depositing a ruthenium oxide film on the sidewalls of the via and on the sidewalls of the trench,
   wherein forming the ruthenium liner on the sidewalls of the via and on the sidewalls of the trench comprises:
     forming the ruthenium liner over the ruthenium oxide film on the sidewalls of the via and over the ruthenium oxide film on the sidewalls of the trench.

7. The method of claim 6, wherein a thickness of the ruthenium oxide film is in a range of approximately 5 angstroms to approximately 10 angstroms; and
   wherein a thickness of the ruthenium liner is in a range of approximately 5 angstroms to approximately 25 angstroms.

8. The method of claim 1, wherein a thickness of the ruthenium liner on the bottom surface of the via is equal to or less than approximately 8 angstroms.

9. A method, comprising:
   forming a dual damascene structure in one or more dielectric layers of a device,
     wherein the dual damascene structure comprises a via and a trench above the via;
   performing a pre-treatment operation on a bottom surface of the via to cause the bottom surface of the via to become non-metallic;
   forming, after the pre-treatment operation, a ruthenium oxide film on sidewalls of the via and on sidewalls of the trench;
   performing, after forming the ruthenium oxide film, a plasma treatment operation on the bottom surface of the via to cause the bottom surface of the via to become metallic;
   forming, after the plasma treatment operation, a ruthenium liner on the ruthenium oxide film and on the bottom surface of the via; and
   forming a copper layer on the ruthenium liner in the trench.

10. The method of claim 9, wherein the bottom surface of the via being metallic promotes adhesion between the ruthenium liner and the bottom surface of the via.

11. The method of claim 9, wherein the bottom surface of the via being non-metallic blocks ruthenium precursors of the ruthenium oxide film from being absorbed into the bottom surface of the via.

12. The method of claim 9, further comprising:
   forming the copper layer partially in the via.

13. The method of claim 9, wherein forming the ruthenium liner comprises:
   forming the ruthenium liner on the bottom surface of the via to a thickness that is approximately equal to or greater than a thickness of the ruthenium liner on the ruthenium oxide film.

14. A method, comprising:
   forming, when a bottom surface, of a via of a dual damascene structure, is non-metallic, a ruthenium oxide film on sidewalls, of the via of the dual damascene structure, and on sidewalls, of a trench of the dual damascene structure and filling, when the bottom surface of the via is metallic, the trench with a copper layer.

15. The method of claim 14, further comprising:

forming a ruthenium liner on the ruthenium oxide film and on the bottom surface of the via when the bottom surface of the via is non-metallic, wherein the via and the trench is filled with the copper layer after forming the ruthenium liner.

16. The method of claim 15, wherein forming the ruthenium liner comprises:

forming the ruthenium liner on the bottom surface of the via to a thickness that is approximately equal to or greater than a thickness of the ruthenium liner on the ruthenium oxide film.

17. The method of claim 14, further comprising:

filling the via with the copper layer when the bottom surface of the via is metallic.

18. The method of claim 14, further comprising:

performing a treatment operation on the bottom surface of the via to cause the bottom surface of the via to become non-metallic.

19. The method of claim 14, further comprising:

performing a treatment operation on the bottom surface of the via to cause the bottom surface of the via to become metallic.

20. The method of claim 19, wherein the treatment operation is a plasma treatment operation.

* * * * *